United States Patent
Hwang et al.

(10) Patent No.: US 12,213,270 B2
(45) Date of Patent: Jan. 28, 2025

(54) ELECTRONIC DEVICE INCLUDING HOUSING AND METHOD OF MANUFACTURING HOUSING

(71) Applicant: SAMSUNG ELECTRONICS CO., LTD., Suwon-si (KR)

(72) Inventors: Seongyu Hwang, Suwon-si (KR); Sangmin Lee, Suwon-si (KR); Myungjun Kim, Suwon-si (KR); Jongchul Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 265 days.

(21) Appl. No.: 17/847,315

(22) Filed: Jun. 23, 2022

(65) Prior Publication Data

US 2022/0394870 A1    Dec. 8, 2022

Related U.S. Application Data

(63) Continuation of application No. PCT/KR2022/007681, filed on May 30, 2022.

(30) Foreign Application Priority Data

Jun. 3, 2021   (KR) .................... 10-2021-0072085

(51) Int. Cl.
*H05K 5/04*    (2006.01)
*B29C 45/14*   (2006.01)
(Continued)

(52) U.S. Cl.
CPC ............. *H05K 5/04* (2013.01); *G06F 1/1616* (2013.01); *G06F 1/1633* (2013.01);
(Continued)

(58) Field of Classification Search
CPC .................... H05K 5/04; H05K 5/0217; B29L 2031/3437; G06F 1/1616; G06F 1/1636
See application file for complete search history.

(56) References Cited

U.S. PATENT DOCUMENTS 8,520,372 B2    8/2013  Shiroishi et al.
8,747,719 B2*   6/2014  Lee .................... G06F 1/181
                                              427/327
(Continued)

FOREIGN PATENT DOCUMENTS

AU    2018203006    11/2019
CN     203504897     3/2014
(Continued)

OTHER PUBLICATIONS

Search Report and Written Opinion dated Sep. 1, 2022 issued in International Patent Application No. PCT/KR2022/007681.
(Continued)

*Primary Examiner* — Daniel J Rohrhoff
(74) *Attorney, Agent, or Firm* — NIXON & VANDERHYE P.C.

(57) ABSTRACT

According to an embodiment of the disclosure, an electronic device may include: a housing defining at least one surface of the electronic device. The housing may include: a metal plate comprising at least one penetration hole, a first nonmetallic part combined with the metal plate and surrounding at least a part of a side surface of the metal plate, and a second nonmetallic part at least partially disposed in the at least one penetration hole and providing a part of the one surface.

20 Claims, 21 Drawing Sheets

(51) Int. Cl.
    *B29L 31/34*           (2006.01)
    *G06F 1/16*            (2006.01)
    *H05K 5/02*           (2006.01)

(52) U.S. Cl.
    CPC ......... *G06F 1/1656* (2013.01); *H05K 5/0247* (2013.01); *B29C 45/14344* (2013.01); *B29L 2031/3481* (2013.01)

(56) References Cited

U.S. PATENT DOCUMENTS

| | | | |
|---|---|---|---|
| 9,354,662 | B2 * | 5/2016 | Ohishi .................. G06F 1/1637 |
| 10,003,679 | B2 | 6/2018 | Lee et al. |
| 10,620,673 | B2 | 4/2020 | Thomason et al. |
| 2002/0021549 | A1 | 2/2002 | Kono et al. |
| 2009/0265915 | A1 * | 10/2009 | Lee .......................... H01Q 1/40 264/272.11 |
| 2009/0268120 | A1 * | 10/2009 | Ogatsu .................. H04M 1/185 361/829 |
| 2010/0270052 | A1 | 10/2010 | Crohas et al. |
| 2012/0152792 | A1 * | 6/2012 | Chun ................ B29C 45/14065 206/524.1 |
| 2013/0004608 | A1 * | 1/2013 | Yeh .................. B29C 45/14778 425/129.1 |
| 2013/0308261 | A1 * | 11/2013 | Matsumoto ........... G06F 1/1662 361/747 |
| 2013/0318766 | A1 | 12/2013 | Kiple et al. |
| 2015/0224689 | A1 | 8/2015 | Kawada et al. |
| 2018/0343332 | A1 * | 11/2018 | Kim ....................... H04M 1/026 |
| 2019/0341688 | A1 * | 11/2019 | Kim ....................... H01Q 1/243 |
| 2020/0236796 | A1 * | 7/2020 | Hwang ................. H05K 5/0034 |
| 2020/0260605 | A1 * | 8/2020 | Lee ....................... H05K 5/0017 |
| 2022/0224001 | A1 | 7/2022 | Tominaga et al. |
| 2023/0026298 | A1 * | 1/2023 | Ahn ....................... H04M 1/026 |
| 2023/0099705 | A1 * | 3/2023 | Shin ..................... G06F 1/1656 361/679.01 |
| 2023/0289000 | A1 * | 9/2023 | Liu ..................... G06F 3/03547 |
| 2023/0380111 | A1 * | 11/2023 | Lee ........................... H05K 5/03 |

FOREIGN PATENT DOCUMENTS

| | | |
|---|---|---|
| JP | 077284 | 1/1995 |
| JP | 2009-285991 | 12/2009 |
| JP | 2013-508818 | 3/2013 |
| KR | 10-2010-0052333 | 5/2010 |
| KR | 10-1100081 | 12/2011 |
| KR | 10-1695709 | 1/2017 |
| KR | 10-2018-0045223 | 5/2018 |
| WO | 2020/218277 | 10/2020 |

OTHER PUBLICATIONS

Extended European Search Report for EP Application No. 22816414.1 dated Sep. 5, 2024, 11 pages.

* cited by examiner

ELECTRONIC DEVICE INCLUDING HOUSING AND METHOD OF MANUFACTURING HOUSING

CROSS-REFERENCE TO RELATED APPLICATIONS

This application is a continuation of International Application No. PCT/KR2022/007681 designating the United States, filed on May 30, 2022, in the Korean Intellectual Property Receiving Office and claiming priority to Korean Patent Application No. 10-2021-0072085, filed on Jun. 3, 2021 in the Korean Intellectual Property Office, the disclosures of which are incorporated by reference herein in their entireties.

BACKGROUND

Field

The disclosure relates to an electronic device including a housing and a method of manufacturing the housing.

Description of Related Art

A portable electronic device becomes lightweight and slim. As a design of the portable electronic device emerges as a differentiating factor due to the upward leveling of specifications of the portable electronic device, a housing (e.g., an external appearance member) may be implemented to have visually luxurious texture while securing rigidity compared to a thin thickness.

If at least a part of a housing is manufactured in a thin plate form (or a thin plate structure), a method of easily manufacturing the housing while securing the rigidity and quality of the housing is devised.

SUMMARY

Embodiments of the disclosure may provide an electronic device including a housing having a thin plate form and a method of manufacturing the housing, which can secure rigidity, quality, or manufacturing easiness.

According to an example embodiment of the disclosure, an electronic device may include: a housing providing one surface of the electronic device. The housing may include: a metal plate comprising at least one penetration hole, a first nonmetallic part combined with the metal plate and surrounding at least a part of a side surface of the metal plate, and a second nonmetallic part at least partially disposed in the at least one penetration hole and providing a part of the one surface.

According to an example embodiment of the disclosure, an electronic device may include: a housing providing one surface of the electronic device and having a thin plate form. The housing may include: a metal plate comprising at least one penetration hole, a first nonmetallic part combined with the metal plate, and a second nonmetallic part at least partially disposed in the at least one penetration hole providing a part of the one surface. The one surface of the housing may include: a first area formed by the first nonmetallic part, a second area formed by the second nonmetallic part, and a third area formed by the metal plate. The first nonmetallic part and the second nonmetallic part may be formed using a die, and the at least one penetration hole may be used to guide a location where the metal plate is disposed within the die.

Various example embodiments of the disclosure may improve reliability of a housing because the rigidity, quality, or manufacturing easiness of the housing having a thin plate form can be improved.

In addition, effects which may be obtained or predicted by various example embodiments of the disclosure may be directly or implicitly disclosed in the detailed description. For example, various effects predicted according to various example embodiments of the disclosure will be disclosed in the following detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
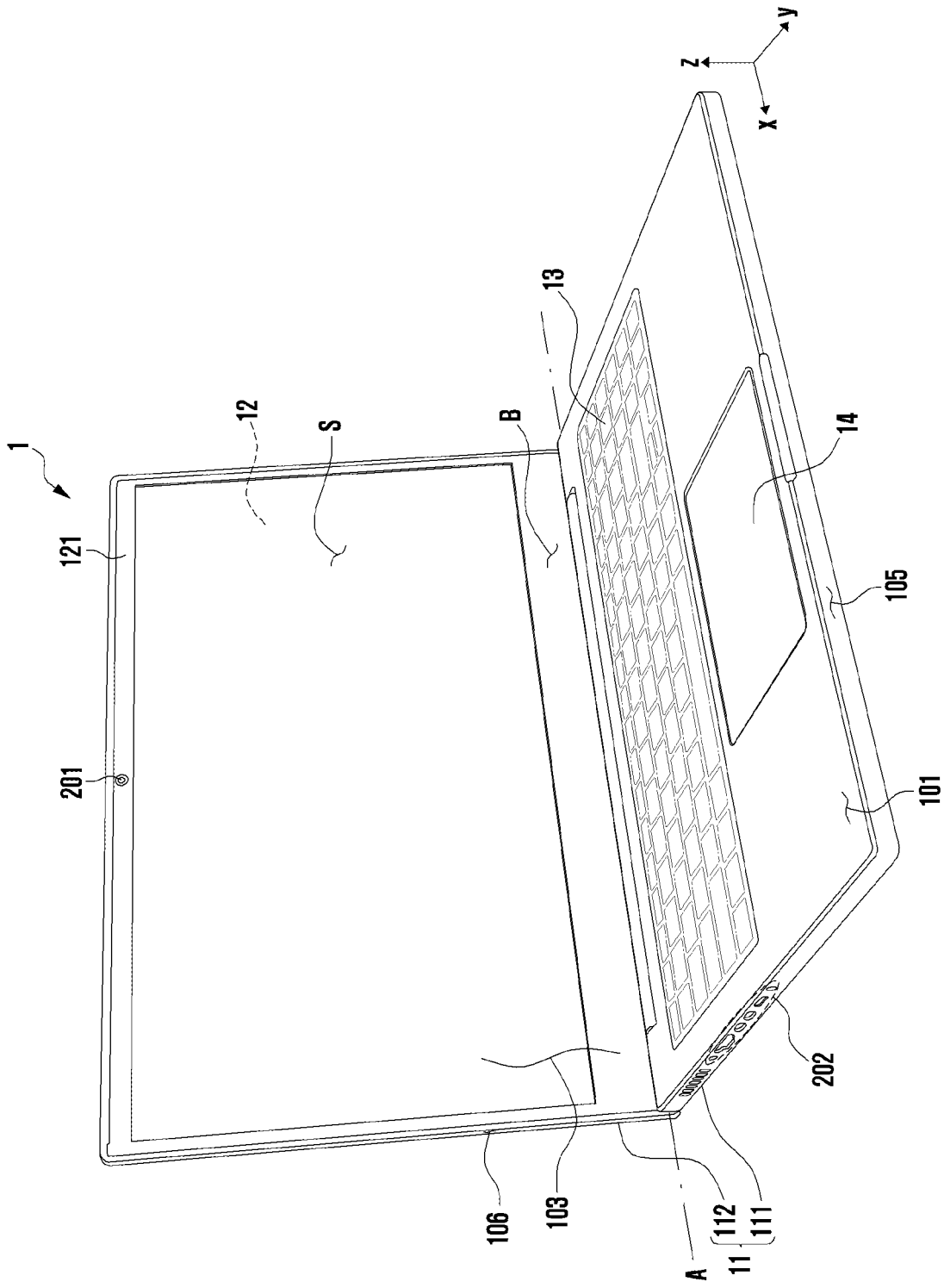
FIG. 1 is a perspective view illustrating an electronic device in an unfolded state according to various embodiments.

Hereinafter, various example embodiments of the disclosure are described with reference to the accompanying drawings.

Various embodiments of the disclosure and terms used in describing the various embodiments are not intended to limit the technical characteristics, described in this disclosure, to specific embodiments, and should be understood as including various changes, equivalents or alternatives of a corresponding embodiment. In relation to the description of the drawings, similar reference numerals may be used for similar or related elements. A singular form of a noun corresponding to an item may include one item or a plurality of items unless explicitly described otherwise in the context. In this disclosure, each of phrases, such as "A or B", "at least one of A and B", "at least one of A or B", "A, B or C", "at least one of A, B and C", and "at least one of A, B, or C", may include any one of items listed along with a corresponding one of the phrases or all possible combinations of the listed items. Terms, such as a "first", a "second", or "the first" or "the second", may be used to merely distinguish between a corresponding element and another corresponding element, and do not limit corresponding elements in another aspect (e.g., importance or a sequence).

According to various embodiments, each of the described elements may include a single entity or a plurality of entities, and some of a plurality of entities may be separately disposed in another element. According to various embodiments, one or more elements or operations of the aforementioned elements may be omitted or one or more other elements or operations may be added. Alternatively or additionally, a plurality of elements may be integrated into a single element. In such a case, the integrated element may identically or similarly perform a function performed by a corresponding one of the plurality of elements before at least one function of the plurality of elements is integrated.

Figure 2:
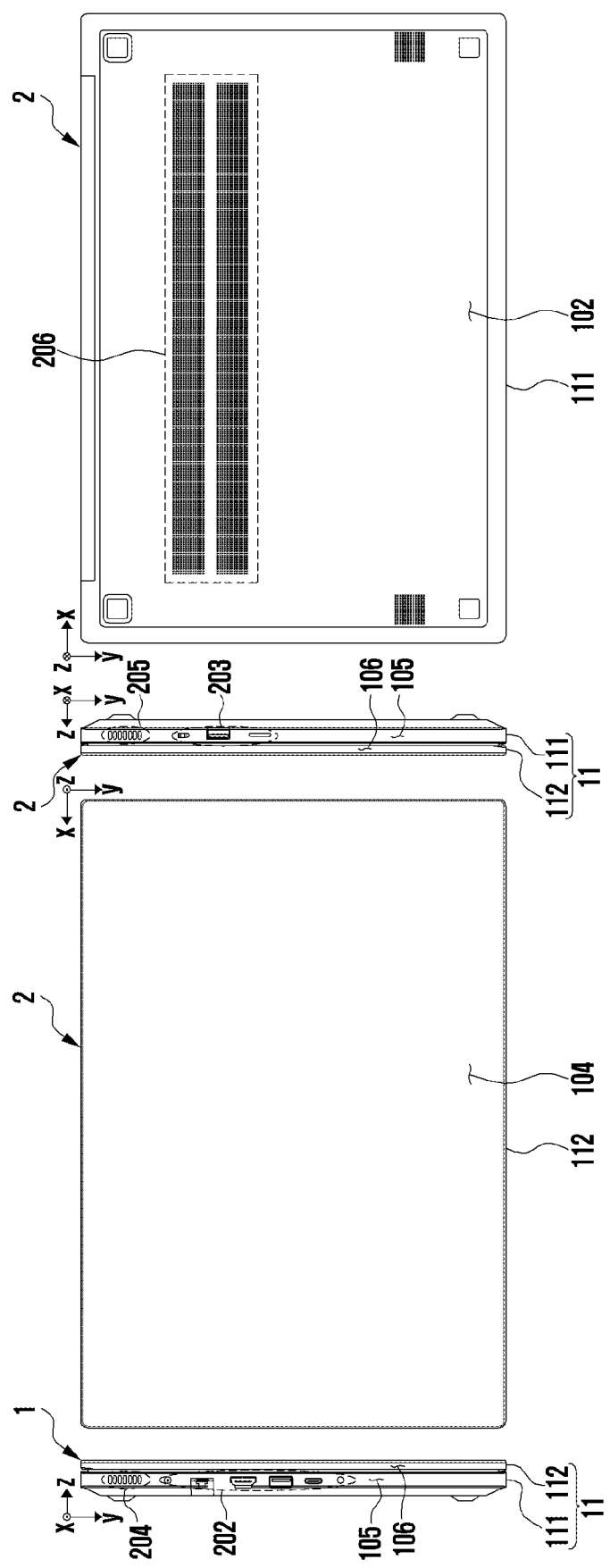
FIG. 2 is a diagram illustrating the electronic device in a folded state according to various embodiments.

FIG. 1 is a perspective view illustrating an example electronic device 1 in an unfolded state according to various embodiments. FIG. 2 is a perspective view illustrating the electronic device 1 in a folded state according to various embodiments.

With reference to FIGS. 1 and 2, according to an example embodiment, the electronic device 1 may include a foldable housing 11, a display 12, a keyboard 13 and/or a touch pad 14. The electronic device 1 may include, for example, and without limitation, a laptop computer (or a notebook computer).

According to an embodiment, the foldable housing 11 may include a first housing (or a first housing part or a first housing structure) 111, a second housing (or a second housing part or a second housing structure) 112 and/or a hinge assembly. The first housing 111 and the second housing 112 are connected by the hinge assembly, and may rotate with respect to each other on the basis of a folding axis A of the foldable housing 11 (e.g., the rotating axis of the hinge assembly). The hinge assembly may include at least one hinge that connects the first housing 111 and the second housing 112, and may provide the folding axis A of the foldable housing 11. The first housing 111 or the second housing 112 may be formed using ceramic, polymer, metal (e.g., aluminum, stainless steel, or magnesium), or a combination of at least two of the materials, for example. The first housing 111 may include a first surface 101 of the electronic device 1, and a second surface 102 of the electronic device 1 disposed on a side opposite to the first surface 101. The first housing 111 may include a first side surface 105 of the electronic device 1 that surrounds at least a part of a space between the first surface 101 and the second surface 102. The second housing 112 may include a third surface 103 of the electronic device 1, and a fourth surface 104 of the electronic device 1 disposed on a side opposite to the third surface 103. The second housing 112 may include a second side surface 106 of the electronic device 1 that surrounds at least a part of a space between the third surface 103 and the fourth surface 104. In an embodiment, the first housing 111 may denote a structure that provides at least some of the first surface 101, the second surface 102, and the first side surface 105. The second housing 112 may denote a structure that provides at least some of the third surface 103, the fourth surface 104, and the second side surface 106. A folded state (refer to FIG. 2) of the electronic device 1 may indicate a state in which the first housing 111 and the second housing 112 have been disposed so that the first surface 101 and the third surface 103 become close to each other. For example, in the folded state of the electronic device 1, the first surface 101 and the third surface 103 may face each other to form an angle of about 0 degree to about 10 degrees, and may not be substantially exposed (e.g., visible) to the outside. In the folded state of the electronic device 1, the second surface 102 and the fourth surface 104 may be substantially directed in opposite directions. In the folded state of the electronic device 1, the first side surface 105 and the second side surface 106 may be lined up with each other. An unfolded state (refer to FIG. 1) of the electronic device 1 may indicate a state other than the folded state of the electronic device 1.

According to an embodiment, the foldable housing 11 may be implemented to enable the first housing 111 and the second housing 112 to be disposed so that the second surface 102 and the fourth surface 104 to no longer be close to each other while facing each other. In this case, for example, the second surface 102 and the fourth surface 104 may form an angle of about 0 degree to about 10 degrees, and may not be substantially exposed to the outside.

According to an embodiment, the display 12 may be disposed in the second housing 112. For example, the second housing 112 may include a transparent plate 121 that provides at least a part of the third surface 103. At least a part of the display 12 may overlap the transparent plate 121, and the display 12 may be disposed in an internal space of the second housing 112. The transparent plate 121 can protect the display 12 against the outside. Light output by the display 12 may proceed to the outside through the transparent plate 121. A screen S of the electronic device 1 may indicate an area in which an image may be represented in a device including the display 12 and the transparent plate 121, and may include a display area (or an active area) of the display 12 and some area of the transparent plate 121 overlapped with the display area, for example. In an embodiment, the transparent plate 121 may be integrated and formed with the display 12 as an element included in the display 12. The transparent plate 121 may include various materials such as polymer or glass. In an embodiment, the transparent plate 121 may include a plurality of layers. For example, the transparent plate 121 may have a form in which a coating layer or protection layer using various polymer materials (e.g., polyester (ET), polyimide (PI), or thermoplastic polyurethane (TPU)) has been disposed in a plastic plate or a glass plate. An edge area of the third surface 103 that surrounds the screen S may be substantially opaque, and may provide a screen bezel B, for example. For example, an opaque material may be disposed on the back surface of an area of the transparent plate 121 which corresponds to the screen bezel B. The screen S is not limited to the illustrated example and may be further extended. For example, the screen S of the third surface 103 may account for about 90% or more (e.g., a bezel-less display or a full screen display). In an embodiment, the second housing 112 may include the screen bezel B including an opening. The display 12 may be disposed in the opening, and may provide the third surface 103 along with the screen bezel B. In an embodiment, the display 12 may include a touch sensor (or a touch detection circuit) configured to detect a touch and a pressure sensor configured to measure the intensity of a force generated by the touch. In an embodiment, the display 12 may include an electromagnetic induction panel (e.g., a digitizer) for detecting a pen input device (e.g., a stylus pen) using a magnetic field method or may be combined with an electromagnetic induction panel.

According to an embodiment, the electronic device 1 may include an input module, an acoustic output module, a camera module (e.g., including a camera) 201, a sensor module and/or a plurality of connection terminals 202 and 203. In an embodiment, the electronic device 1 may omit at least one of the elements or may additionally include another element. Locations or the number of elements included in the electronic device 1 is not limited to the illustrated example and may be various.

The input module may include the keyboard 13, for example. The keyboard 13 may be disposed in the first housing 111. The first housing 111 may include a plurality of openings provided in the first surface 101. A plurality of buttons (or keys) of the keyboard 13 may be disposed in the plurality of openings and exposed to the outside. The input module may further include another key input device (e.g., a power button) separated from the keyboard 13. The key input device may be disposed in the first surface 101 or the first side surface 105, but the disclosure is not limited thereto. Locations or the number of key input devices may be various. In an embodiment, at least one key input device may be disposed in the second housing 112. In an embodiment, at least one key input device may be omitted, and the omitted key input device may be implemented in another form, such as a soft key, on the display 12.

The input module may include the touch pad 14, for example. The touch pad 14 may be disposed in the first housing 111. The touch pad 14 may include a touch detection circuit disposed in a substrate (not illustrated) embedded in a surface thereof or disposed along a surface thereof as a pointing device exposed to the first surface 101. The touch pad 14 may include a cover area at least partially overlapping the substrate including the touch detection circuit and providing a part of the first surface 101. The cover area may be substantially opaque. The cover area exposed to the outside may provide a touch input surface for receiving or detecting a touch by a user input. For example, when a finger comes into contact with the touch input surface or arrives within a critical distance from the touch input surface, a signal about coordinates may be generated. A click button (e.g., a push switch including a metal dome) may be disposed under the touch pad 14. When the touch input surface is pressurized, an input may be generated from the push button.

The input module may include a microphone disposed within the electronic device 1 and a microphone hole provided in the first housing 111 or the second housing 112 in accordance with the microphone, for example. Locations or the number of input modules each including the microphone and the microphone hole corresponding to the microphone may be various. In an embodiment, the electronic device 1 may include a plurality of microphones capable of detecting a direction of a sound. The microphone hole may be provided in the first side surface 105 or the second surface 102, for example.

The input module may include at least one sensor, for example. In an embodiment, the input module may include a touch sensor (or a touch detection circuit) or a pressure sensor disposed or included in the display 12. In various embodiments, the input module may include an electromagnetic induction panel (e.g., a digitizer) disposed or included in the display 12, for example.

According to various embodiments, the electronic device 1 may be implemented by omitting some of input modules or adding another input module depending on a provision form thereof or convergence tendency. In an embodiment, the display 12 including the touch sensor (or the touch detection circuit) or the pressure sensor as the input module is not limited to the illustrated examples, and may be implemented as a foldable display or a flexible display extended to the first housing 111. For example, if the display 12 is implemented as a flexible display extended to the first housing 111, the flexible display may include a first display area corresponding to the first housing 111, a second display area corresponding to the second housing 112, and a third display area corresponding to a hinge assembly (e.g., a folding part) that connects the first housing 111 and the second housing 112. The third display area may be disposed in an unfolded state or a bent state depending on an angle formed by the first housing 111 and the second housing 112. If the display 12 is implemented as a flexible display extended to the first housing 111, the keyboard 13 or the touch pad 14 may be omitted. The omitted keyboard 13 or touch pad 14 may be implemented in a form displayed through the flexible display (or the first display area).

The acoustic output module may include a speaker disposed within the electronic device 1 and a speaker hole provided in the first housing 111 or the second housing 112 in accordance with the speaker, for example. The speaker hole may be provided in the first side surface 105 or the second surface 102, for example. Locations or the number of acoustic output modules each including the speaker and the speaker hole corresponding to the speaker may be various. In an embodiment, the microphone hole and the speaker hole may be implemented as one hole. In an embodiment, a piezo speaker from which a speaker hole has been omitted may be implemented.

The camera module 201 may be disposed inside the second housing 112 in accordance with the screen bezel B, for example. The camera module 201 may include one or a plurality of lenses, image sensors and/or image signal processors. Locations or the number of camera modules 201 is not limited to the illustrated example and may be various.

According to an embodiment, the display 12 may include an opening aligned with the camera module 201. External light may arrive at the camera module 201 through the transparent plate 121 and the opening of the display 12. In an embodiment, the opening of the display 12 may be formed in a notch form depending on a location of the camera module 201. In an embodiment, the camera module 201 may be disposed below the display 12, and may perform a related function (e.g., image capturing) in a way that the location of the camera module 201 is not visually distinguished (or exposed). For example, the camera module 201 may be disposed on the back surface of the display 12 or below or beneath the display 12, and may include an under display camera (UDC). In an embodiment, the camera module 201 may be aligned with a recess provided in the back surface of the display 12 and may be disposed therein. The camera module 301 may be disposed in a way to overlap at least a part of the screen S, and may obtain an image of an external subject while being not visually exposed to the outside. In this case, some area of the display 12 at least partially overlapping the camera module 201 may include a different pixel structure and/or wiring structure compared to another area. For example, some area of the display 12 at least partially overlapping the camera module 201 may have different pixel density compared to another area. A pixel structure and/or wiring structure provided in some area of the display 12 at least partially overlapping the camera module 201 can reduce a loss of light between the outside and the camera module 201. In an embodiment, a pixel may not be disposed in some area of the display 12 at least partially overlapping the camera module 201. In an embodiment, the camera module 201 may be implemented as a plurality of camera modules (e.g., a dual camera module or a triple camera module) having different attributes (e.g., view angles) or functions. For example, the plurality of camera modules may include camera modules, including lenses having different view angles, in plural. The electronic device 1 may control to change a view angle of the camera module performed in the electronic device 1, based on a user selection. The plurality of camera modules may include at least one of a wide-angle camera, a telescopic camera, a color camera, a monochrome camera, or an infrared (IR) camera (e.g., a time of flight (TOF) camera, a structured light camera). In an embodiment, the IR camera may operate as at least a part of the sensor module.

The sensor module may generate an electric signal or a data value corresponding to an operating state within the electronic device 1 or an external environment state. The sensor module may include at least one of a proximity sensor, a gesture sensor, a gyro sensor, an atmospheric sensor, a magnetic sensor, an acceleration sensor, a grip sensor, a color sensor, an infrared (IR) sensor, a bio sensor (e.g., a fingerprint sensor or an HRM sensor), a temperature sensor, a humidity sensor, or an illumination sensor, for example.

The plurality of connection terminals 202 and 203 may include connectors (e.g., an HDMI connector, a USB connector interface, an SD card connector, or an audio connector) disposed within the electronic device 1 and connector holes provided in the first housing 111 in accordance with the connectors, for example. The electronic device 1 may transmit and/or receive power and/or data to and/or from an external electronic device electrically connected to the connector through the connector hole. Locations or the number of connectors and connector holes corresponding to the connectors is not limited to the illustrated example and may be various.

According to an embodiment, the electronic device 1 may include a pen input device (e.g., an electronic pen, a digital pen or a stylus pen) which may be attached or detached.

According to an embodiment, the foldable housing 11 may include at least one air intake and at least one air outlet. External air may be introduced into the foldable housing 11 through the at least one air intake. Air to which heat emitted from at least one part is delivered may be discharged to the outside of the foldable housing 11 through the at least one air outlet. In an embodiment, a plurality of openings 204 and 205 provided in the first side surface 105 may be used as an air intake or an air outlet. In an embodiment, a plurality of openings 206 provided in the second surface 102 may be used as an air intake or an air outlet.

The electronic device 1 of the disclosure may be an electronic device having various other forms. The electronic device may include, for example, a portable communication device (e.g., a smartphone), a computer device, a portable multimedia device, a portable medical device, camera, a wearable device, home appliances, or the like. The electronic device according to an embodiment of this disclosure is not limited to the aforementioned devices.

Figure 3:
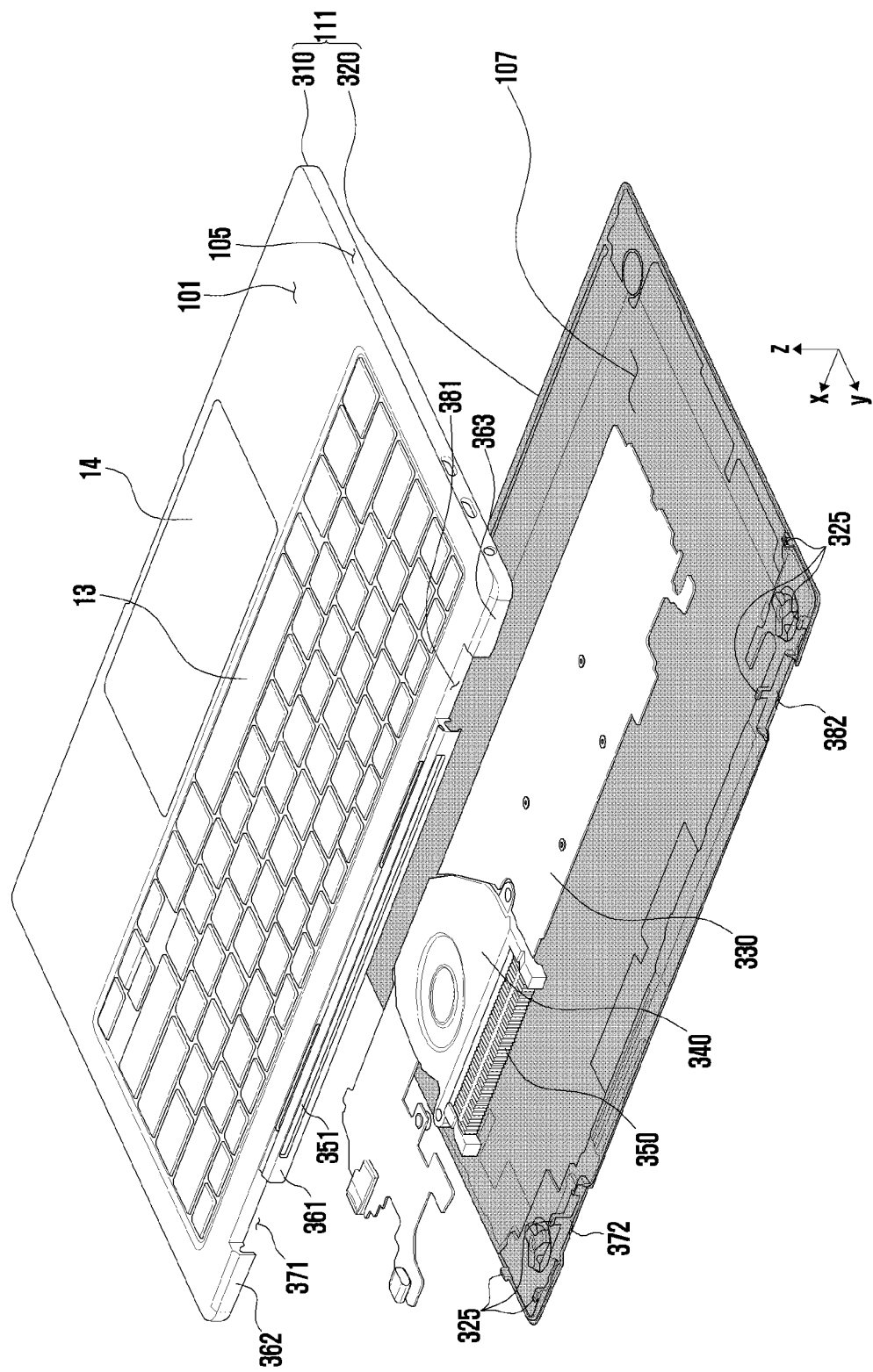
FIG. 3 is an exploded perspective view of a part of the electronic device in FIG. 1 according to various embodiments.

FIG. 3 is an exploded perspective view of the electronic device 1 in FIG. 1 according to various embodiments.

With reference to FIG. 3, in an embodiment, the electronic device 1 may include the first housing 111, the keyboard 13, the touch pad 14, a printed circuit board 330, an air blast device 340 and/or a first heat conduction member (e.g., including a heat conducting structure comprising a heat conducting material) 350.

According to an embodiment, the first housing 111 may include a case (or frame) 310 and a back cover 320. The case 310 may include at least a part of the first surface 101 and at least a part of the first side surface 105, for example. In an embodiment, the back cover 320 may be implemented in a thin plate form (or as a thin plate structure). For example, the back cover 320 may include the second surface 102 (refer to FIG. 2) and a fifth surface 107 disposed on a side opposite to the second surface 102. A height (e.g., the thickness of the back cover 320) between the second surface 102 and the fifth surface 107 may, for example, be about 5 mm or less. The back cover 320 may be attached to and detached from the case 310. In an embodiment, the back cover 320 may include a plurality of hooks 325 for snap-fit fastening with the case 310 and/or a plurality of bolt fastening holes (not illustrated) for bolt fastening to the case 310. The case 310 or the back cover 320 may include polymer and/or metal (e.g., aluminum, stainless steel, or magnesium), for example. The keyboard 13 and the touch pad 14 may be disposed in the case 310. The printed circuit board 330, the air blast device 340, and the first heat conduction member 350 may be disposed in the case 310 between the case 310 and the back cover 320. In an embodiment, a support member (e.g., a bracket) (not illustrated) may be disposed between the case 310 and the back cover 320. Elements, such as the printed circuit board 330, the air blast device 340, and the first heat conduction member 350, may be disposed in the support member. Various parts, such as a processor, a wireless communication module, a power management module, or the plurality of connection terminals 202 and 203 (refer to FIG. 2), for example, may be disposed in the printed circuit board 330. The keyboard 13 or the touch pad 14 may be electrically connected to the printed circuit board 330 using an electrical path, such as a flexible printed circuit (FPCB). A heat radiation structure for preventing and/or reducing/avoiding the overheating of at least one part by discharging, to the outside, heat emitted from at least one part may be disposed within the first housing 111. The heat radiation structure may include the air blast device 340, the first heat conduction member 350 and/or a second heat conduction member (not illustrated), for example. A pressure difference may occur between the inside and outside of the first housing 111 due to a flow of the air by the air blast device 340. Accordingly, external air (open air) may be introduced into the first housing 111 through at least one air intake (e.g., the plurality of openings 204, 205, or 206 in FIG. 2) provided in the first housing 111. The air introduced into the first housing 111 through the air intake may flow into an air intake part of the air blast device 340 due to forced convection by the air blast device 340, and may be discharged through an air discharge part of the air blast device 340. The first heat conduction member 350 (e.g., a heat sink) may be combined with the air discharge part of the air blast device 340, and may be aligned and disposed with at least one air outlet 351 provided in the first side surface 105. The second heat conduction member (e.g., a heat spreader, a heat pipe, or a vapor chamber) may receive the heat emitted from at least one part. The heat emitted from the at least one part may move from the second heat conduction member to the first heat conduction member 350 due to the conduction of the heat flowing from a high temperature part to a low temperature part. A convection heat transfer, that is, an energy transfer method between a solid surface and gas, may act between the first heat conduction member 350 and the air, and corresponding heat may be discharged to the outside through the at least one air outlet 351 provided in the first side surface 105. Convection heat transfer performance between the first heat conduction member 350 and the air can be secured due to forced convection by the air blast device 340. In an embodiment, the electronic device 1 may omit at least one of the elements or may additionally include another element.

According to an embodiment, the first housing 111 may include a hinge connection structure for rotatably connecting the first housing 111 to the second housing 112 (refer to FIG. 1). The hinge connection structure may be disposed on the edge side of the first housing 111 on one side connected to the second housing 112. The hinge connection structure may include a first hinge arm 361, a second hinge arm 362, a third hinge arm 363, first recess structures 371 and 372 and/or second recess structures 381 and 382, for example. The first hinge arm 361, the second hinge arm 362, and the third hinge arm 363 may be included in the case 310. The first hinge arm 361 may be disposed between the second hinge arm 362 and the third hinge arm 363. In an embodiment, the first recess structures 371 and 372 may include a notch structure 371 by the case 310 and a notch structure 372 by the back cover 320, and may be provided with a first recess into which a part of the second housing 112 may be inserted due to the combination of the notch structures 371 and 372. In an embodiment, the second recess structures 381 and 382 may include a notch structure 381 by the case 310 and a notch structure 382 by the back cover 320, and may be provided with a second recess into which another part of the second housing 112 may be inserted by the combination of the notch structures 381 and 382. A part of the second housing 112 may be disposed in the first recess by the first recess structures 371 and 372, and may be connected to the first hinge arm 361 and the second hinge arm 362 by a hinge in a way to rotate. Another part of the second housing 112 may be disposed in the second recess by the second recess structures 381 and 382, and may be connected to the first hinge arm 361 and the third hinge arm 363 by a hinge in a way to rotate. In an embodiment, the first recess or the second recess may be implemented by the case 310.

Figure 4:
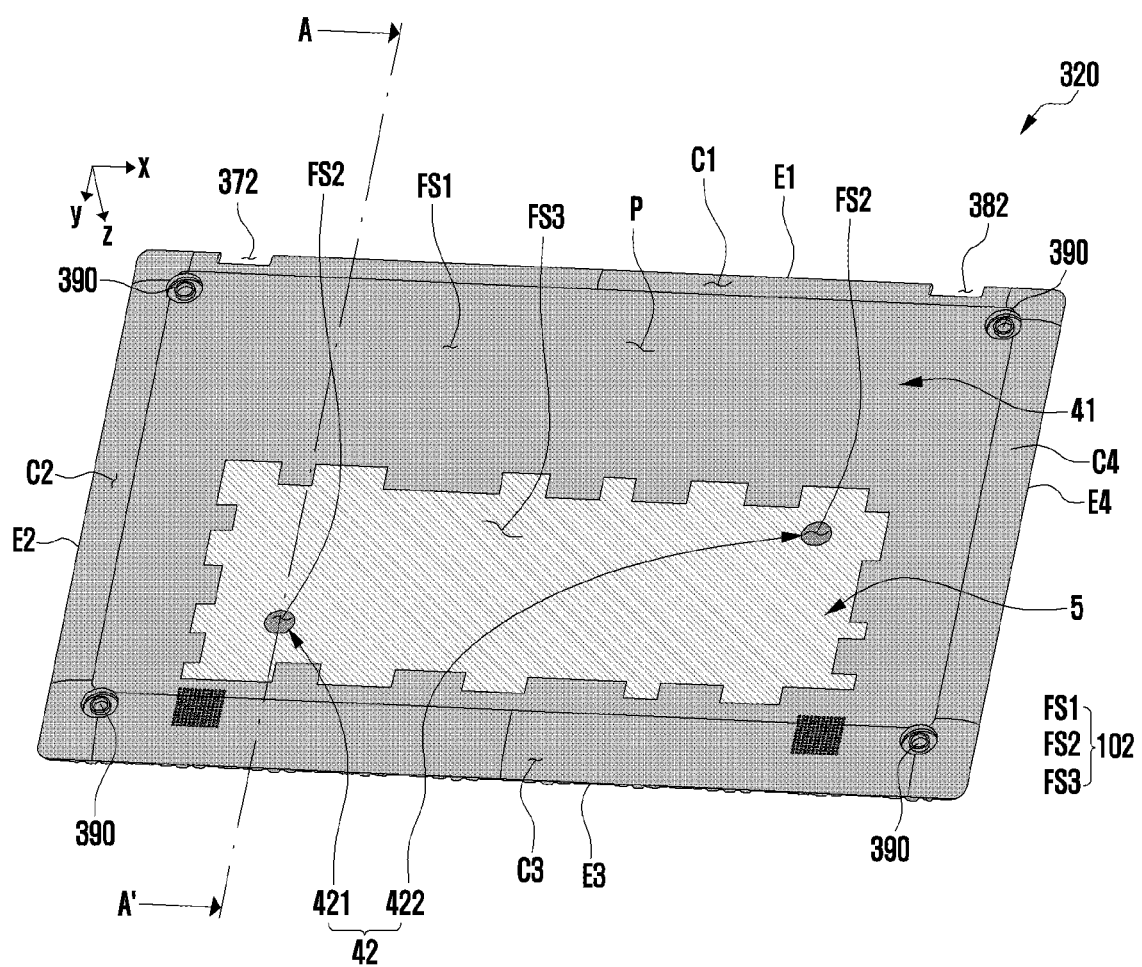
FIG. 4 is a perspective view of a back cover according to various embodiments.
Figure 5:
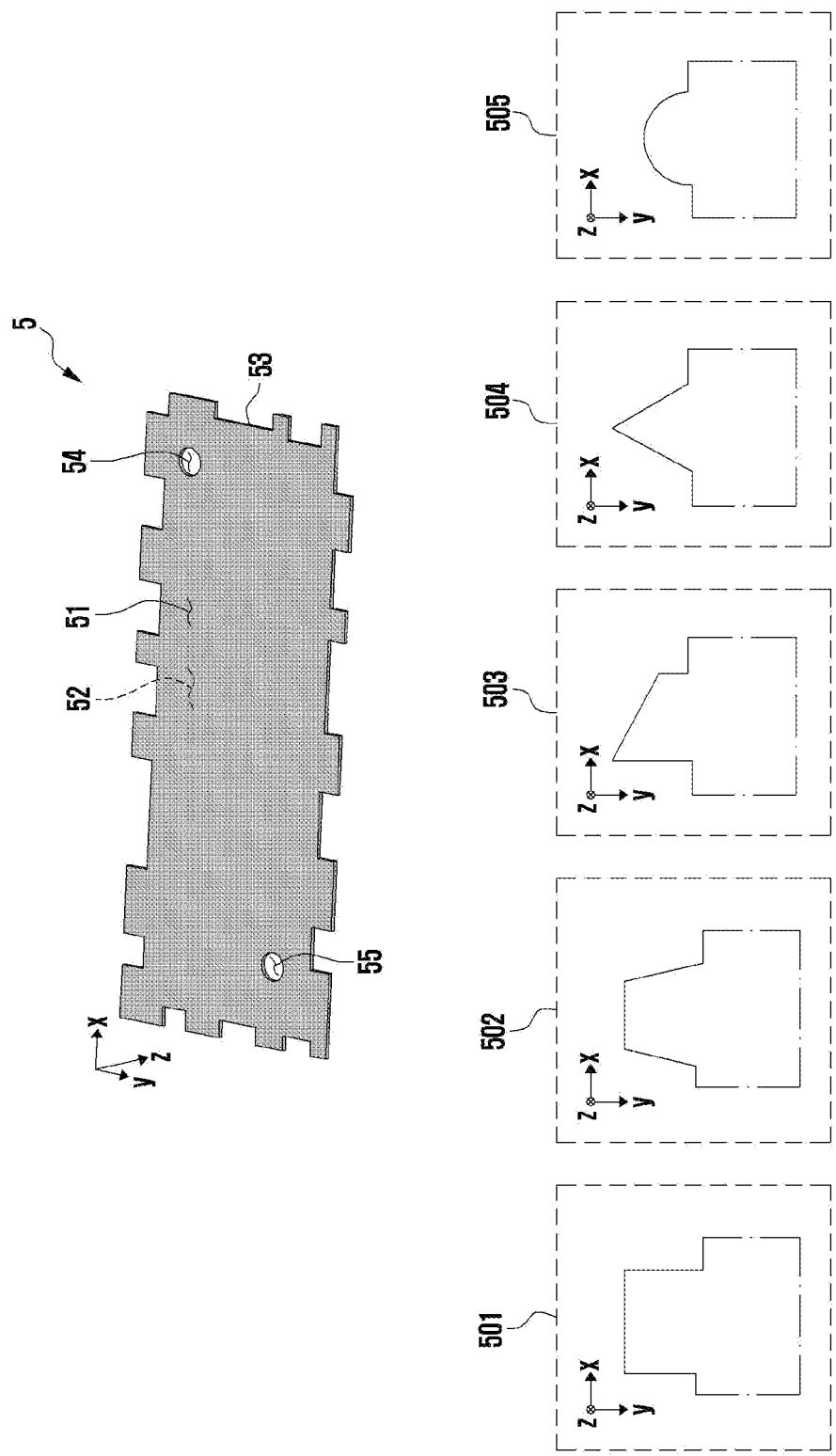
FIG. 5 is a perspective view of a metal plate included in the back cover according to various embodiments.
Figure 6:
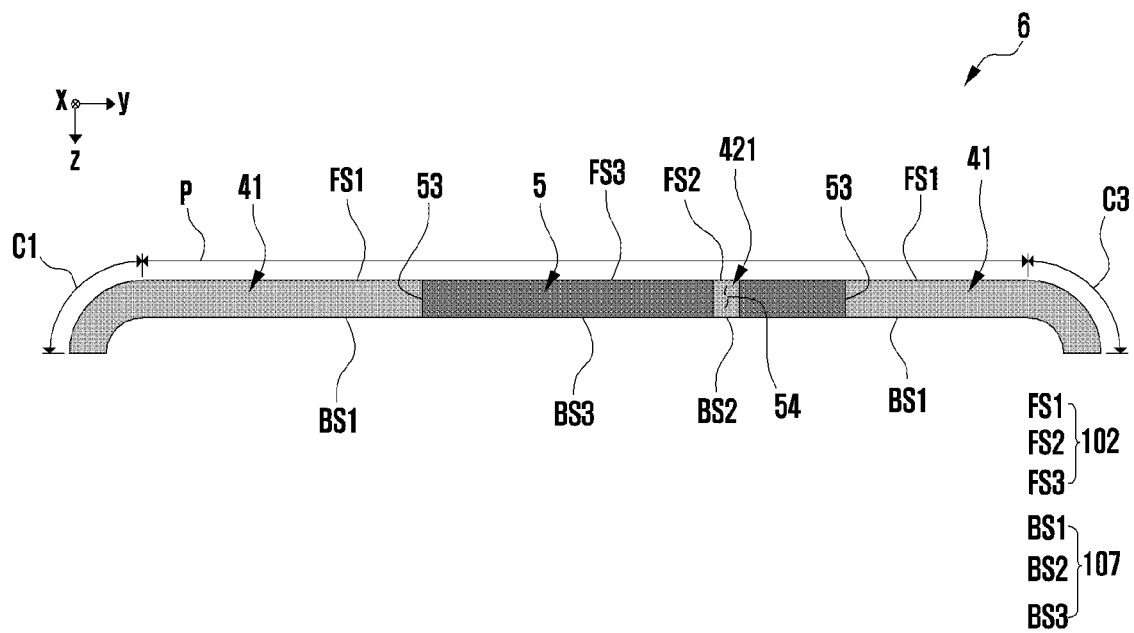
FIG. 6 is a cross-sectional view taken on a y-z plane of line A-A' in FIG. 4 according to various embodiments.

FIG. 4 is a perspective view illustrating the back cover 320 according to various embodiments. FIG. 5 is a perspective view illustrating a metal plate 5 included in the back cover 320 according to various embodiments. FIG. 6 a cross-sectional view 6 taken on a y-z plane along line A-A' in FIG. 4 according to various embodiments.

With reference to FIG. 4, in an embodiment, at least a part of the back cover 320 may be implemented in a thin plate form. A part and another part of the back cover 320 may substantially have the same thickness or different thicknesses. The back cover 320 may include one surface (e.g., the second surface 102) and the other surface (e.g., the fifth surface 107 in FIG. 3) disposed on sides opposite to each other. The second surface 102 providing an external surface of the electronic device 1 may be substantially smoothly formed without concave and convex surfaces.

According to an embodiment, the back cover 320 may include a first edge E1, a second edge E2, a third edge E3 and/or a fourth edge E4. The first edge E1 and the third edge E3 may be disposed on sides opposite to each other and may be substantially parallel to each other. The second edge E2 and the fourth edge E4 may be disposed on sides opposite to each other and may be substantially parallel to each other. The first edge E1 or the third edge E3 may be perpendicular to the second edge E2 or the fourth edge E4. A corner where the first edge E1 and the second edge E2 are connected, a corner where the second edge E2 and the third edge E3 are connected, or a corner where the third edge E3 and the fourth edge E4 are connected may have a round form.

According to an embodiment, the back cover 320 may include a plane part P, a first curved part C1, a second curved part C2, a third curved part C3 and/or a fourth curved part C4. The plane part P may have a rectangular form surrounded by the first curved part C1, the second curved part C2, the third curved part C3, and the fourth curved part C4, for example. When viewed from the top of the second surface 102 (e.g., when viewed in a +z axis direction), the first curved part C1 and the third curved part C3 may be disposed on sides opposite to each other with the plane part P interposed therebetween. When viewed from the top of the second surface 102, the second curved part C2 and the fourth curved part C4 may be disposed on sides opposite to each other with the plane part P interposed therebetween. The first curved part C1 may be bent from the plane part P to the first edge E1 and seamlessly extended. The second curved part C2 may be bent from the plane part P to the second edge E2 and seamlessly extended. The third curved part C3 may be bent from the plane part P to the third edge E3 and seamlessly extended. The fourth curved part C4 may be bent from the plane part P to the fourth edge E4 and seamlessly extended. The first curved part C1 and the second curved part C2 may be smoothly connected at the corner where the first edge E1 and the second edge E2 are connected. The second curved part C2 and the third curved part C3 may be smoothly connected at the corner where the second edge E2 and the third edge E3 are connected. The third curved part C3 and the fourth curved part C4 may be smoothly connected at the corner where the third edge E3 and the fourth edge E4 are connected. The first curved part C1 and the fourth curved part C4 may be smoothly connected at the corner where the first edge E1 and the fourth edge E4 are connected. In an embodiment, a structure including the plane part P and a curved part (e.g., the first curved part C1, the second curved part C2, the third curved part C3 and/or the fourth curved part C4) may contribute to securing torsional rigidity for the back cover 320 having a thin plate form.

With reference to FIGS. 4, 5, and 6, in an embodiment, the back cover 320 may include a first nonmetallic part 41, a second nonmetallic part 42, and a metal plate 5. In an embodiment, the second surface 102 may include a first front surface area FS1 by the first nonmetallic part 41, a second front surface area FS2 by the second nonmetallic part 42, and a third front surface area FS3 by the metal plate 5. In an embodiment, the metal plate 5 may include a plurality of penetration holes 54 and 55. The second nonmetallic part 42 may include a first part 421 disposed in at least a part of one penetration hole 54 and a second part 422 disposed in at least a part of the other penetration hole 55. The first part 421 and the second part 422 may be physically separated from each other. In an embodiment, the disclosure is not limited to the illustrated example. The metal plate 5 may include one penetration hole or three or more penetration holes. The second nonmetallic part 42 may be formed in accordance with the one penetration hole or three or more penetration holes. The second front surface area FS2 by the second nonmetallic part 42 may be surrounded by the third front surface area FS3 by the metal plate 5. At least a part of the third front surface area FS3 by the metal plate 5 may be surrounded by the first front surface area FS1 by the first nonmetallic part 41. The first front surface area FS1 and the third front surface area FS3 may be substantially smoothly connected without a height difference. The second front surface area FS2 and the third front surface area FS3 may be substantially smoothly connected without a height difference.

According to an embodiment, the fifth surface 107 may include a first back surface area BS1 by the first nonmetallic part 41, a second back surface area BS2 by the second nonmetallic part 42, and a third back surface area BS3 by the metal plate 5. The second back surface area BS2 by the second nonmetallic part 42 may be surrounded by the third back surface area BS3 by the metal plate 5. At least a part of the third back surface area BS3 by the metal plate 5 may be surrounded by the first back surface area BS1 by the first nonmetallic part 41.

According to an embodiment, the plane part P of the back cover 320 may be provided by a part of the first nonmetallic part 41, a part of the second nonmetallic part 42, and a part of the metal plate 5. A curved part (e.g., the first curved part C1, the second curved part C2, the third curved part C3, or the fourth curved part C4) of the back cover 320 may be provided by the first nonmetallic part 41. In an embodiment, the metal plate 5 may be extended to at least some of the first curved part C1, the second curved part C2, the third curved part C3, or the fourth curved part C4. Accordingly, the third front surface area FS3 and/or the third back surface area BS3 may be extended.

According to an embodiment, the metal plate 5 may include a metal thin plate. The metal plate 5 (refer to FIG. 5) may include one surface 51 and the other surface 52 disposed on sides opposite to each other, for example. A height (e.g., the thickness of the metal plate 5) between the one surface 51 and the other surface 52 may be about 0.3 mm to about 1.5 mm. The metal plate 5 may include titanium, an amorphous alloy, a metal-ceramic composite material (e.g., cermet), or stainless steel, for example. Furthermore, for example, the metal plate 5 may include magnesium, a magnesium alloy, aluminum, an aluminum alloy, a zinc alloy, or a copper alloy. In an embodiment, a part of the metal plate 5 may include a first metal material. Another part of the metal plate 5 may include a second metal material different from the first metal material. In an embodiment, at least a part of the metal plate 5 may be implemented as a structure in which a plurality of metal layers is stacked.

According to an embodiment, the structure in which a part of the back cover 320 includes the metal plate 5 can reduce a material cost compared to a comparison example in which the entire back cover is formed of a metal plate. In an embodiment, the metal plate 5 may contribute to securing the rigidity of the back cover 320 compared to a comparison example in which the entire back cover is formed of a nonmetallic part.

According to an embodiment, the metal plate 5 may function to reduce electromagnetic interference (e.g., electromagnetic interference (EMI)). For example, the metal plate 5 may be disposed in accordance with at least one part, and can reduce an electromagnetic influence of external noise on the at least one part.

According to an embodiment, the metal plate 5 may contribute to a heat discharge function of the electronic device 1 as a heat conduction member (e.g., a heat spreader). For example, the metal plate 5 may be disposed in accordance with a heat dissipation part disposed within the first housing 111 or may be disposed in a way to receive heat from a heat dissipation part.

According to an embodiment, the metal plate 5 may be electrically connected to a wireless communication circuit included in the electronic device 1, and may operate as an antenna radiator that transmits and/or receives a signal having a selected or designated frequency band.

According to an embodiment, a part and another part of the metal plate 5 may substantially have the same thickness. In an embodiment, a part of the metal plate 5 may have a first thickness, and another part of the metal plate may have a second thickness different from the first thickness.

According to an embodiment, the one surface 51 or other surface 52 of the metal plate 5 may include substantially a plane. For example, the third front surface area FS3 of the second surface 102 may be disposed in the plane part P of the back cover 320. The one surface 51 of the metal plate 5 that provides the third front surface area FS3 may include substantially a plane. In an embodiment, if the metal plate 5 is extended to at least some of the first curved part C1, the second curved part C2, the third curved part C3, or the fourth curved part C4, the third front surface area FS3 may further include a curved surface corresponding to the extended part. In an embodiment, the first nonmetallic part 42 may be extended to have at least a part thereof face the other surface 52 of the metal plate 5 and combined therewith. Accordingly, the first back surface area BS1 may be extended by replacing at least a part of the third back surface area BS3. In this case, in an embodiment, in order to increase a combined area or a bonding force between the first nonmetallic part 42 and the metal plate 5, the other surface 52 of the metal plate 5 may include a concave-convex surface having corresponding surface roughness.

According to an embodiment, the metal plate 5 may be substantially a flat plate that is not bent. In an embodiment, if the metal plate 5 is extended to at least some of the first curved part C1, the second curved part C2, the third curved part C3, or the fourth curved part C4, the metal plate 5 may include a bent part corresponding to the extended part.

According to an embodiment, at least a part of the back cover 320 may be manufactured in a thin plate form using injection molding (e.g., an insert injection molding) for injecting resin after the metal plate 5 is disposed in a die. In an embodiment, the first nonmetallic part 41 or the second nonmetallic part 42 molded in a form combined with the metal plate 5 through the injection molding may have a thickness of about 0.8 mm to about 1.5 mm corresponding to the thin plate form of the back cover 320.

According to an embodiment, the plurality of penetration holes 54 and 55 provided in the metal plate 5 may be used to guide the location of the metal plate 5 when the metal plate 5 is disposed within a die. For example, the die may include a plurality of guide pins corresponding to the plurality of penetration holes 54 and 55. The plurality of guide pins may penetrate through the plurality of penetration holes 54 and 55, so that the metal plate 5 may be disposed within the die. The plurality of guide pins and the plurality of penetration holes 54 and 55 of the metal plate 5 corresponding thereto may contribute to the metal plate 5 so that the metal plate 5 is stably disposed at a designated location on the die 8 (refer to FIG. 8). In an embodiment, the plurality of penetration holes 54 and 55 may be denoted as a plurality of guide holes. In an embodiment, the insert injection molding may include first injection molding performed after the metal plate 5 is disposed within a die and second injection molding performed after the first injection molding. The first nonmetallic part 41 may be formed by the first injection molding. The second nonmetallic part 42 may be formed by the second injection molding. The second injection molding may be performed in the state in which at least some of the plurality of guide pins have not been disposed in the plurality of penetration holes 54 and 55. The number of penetration holes provided in the metal plate 5 is not limited to the illustrated example and may be various. A die may include guide pins having a number corresponding to the number of penetration holes.

According to an embodiment, the first nonmetallic part 41 and the second nonmetallic part 42 may include the same nonmetallic material. In an embodiment, the first nonmetallic part 41 and the second nonmetallic part 42 may include different nonmetallic materials.

According to an embodiment, a side surface 53 (refer to FIGS. 5 and 6) that connects the one surface 51 and other surface 52 of the metal plate 5 may include a concave-convex structure. For example, when viewed from the top of the one surface 51 (e.g., when viewed in a +z axis direction), the concave-convex structure of the side surface 53 may include a plurality of notches. The concave-convex structure of the side surface 53 may contribute to the forming of a stable combination structure between the first nonmetallic part 41 and the metal plate 5 when the first nonmetallic part 41 is formed by primary injection molding. The concave-convex structure of the side surface 53 can improve durability that prevents and/or reduces the first nonmetallic part 41 and the metal plate 5 from being separated from each other against an external impact (e.g., an impact attributable to a drop), compared to a comparison example not including the concave-convex structure. The concave-convex structure of the side surface 53 may be formed in various other forms, such as a triangular notch or a curved notch not limited to a rectangle notch according to the illustrated example. For example, the concave-convex structure of the side surface 53 may include a protruded part (refer to reference numeral "501") having a rectangular form, a protruded part (refer to reference numeral "502") having a trapezoid form, a protruded part (refer to reference numeral "503") having a wedge form, a protruded part (refer to reference numeral "504") having a triangular form, or a protruded part (reference numeral "505") having a rounded form. The concave-convex structure of the side surface 53 may include notches or protruded parts having various other forms different from the illustrated examples. In an embodiment, the first nonmetallic part 41 and the metal plate 5 may be connected as an entangling structure, such as a dovetail joint, due to the concave-convex structure of the side surface 53, thus improving combination durability between the first nonmetallic part 41 and the metal plate 5 (e.g., an anchor effect). In an embodiment, the side surface 53 may replace a concave-convex structure including a plurality of notches or may additionally include a plurality of dimples in a level in which the filling of melt resin is smooth upon primary injection molding.

According to an embodiment, the back cover 320 may include a plurality of mounting parts 390 (refer to FIG. 4) provided to the second surface 102. The plurality of mounting parts 390 may be disposed in accordance with the corner where the first edge E1 and the second edge E2 are connected, the corner where the second edge E2 and the third edge E3 are connected, or the corner where the third edge E3 and the fourth edge E4 are connected. Flexible members (not illustrated), such as rubber, may be disposed in the plurality of mounting parts 390. Each of the plurality of mounting parts 390 may include a fixing structure for combining the flexible member with the back cover 320. The flexible members combined with the plurality of mounting parts 390 may enable the first housing 111 (refer to FIG. 1) to be stably disposed without slipping on the floor, for example. In an embodiment, the flexible members combined with the plurality of mounting parts 390 may enable the second surface 102 to be isolated from the floor and disposed over the floor.

Figure 7:
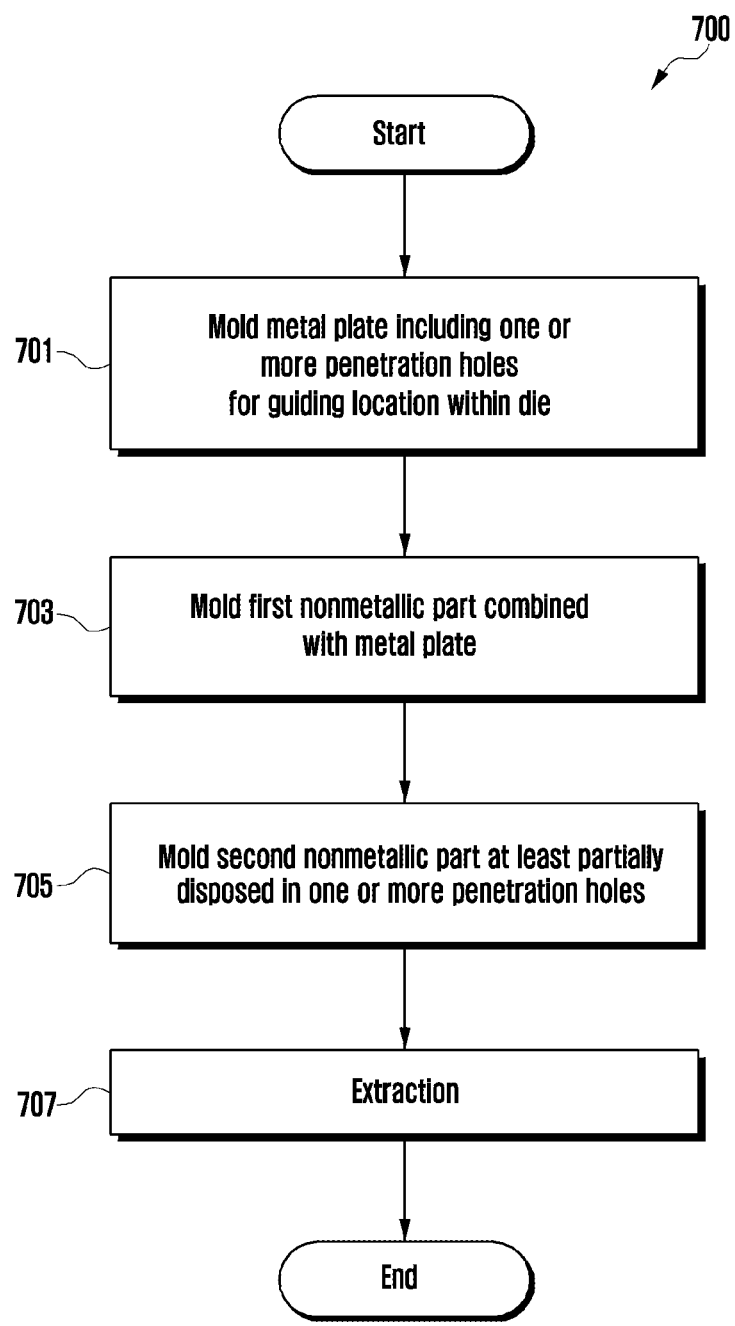
FIG. 7 is a flowchart illustrating an example manufacturing method of making the back cover according to various embodiments.

FIG. 7 is a flowchart illustrating an example method of manufacturing 700 the back cover 320 according to various embodiments. FIGS. 8, 9, 10, 11, 12, and 13 are cross-sectional views of a die 8 for an operation in relation to the manufacturing method 700 of FIG. 7 according to various embodiments.

FIGS. 8, 9, 10, 11, 12, and 13 may be cross-sectional views illustrating various operations of molding the cross-sectional view 6 in FIG. 6, which corresponds to one penetration hole 54 of the metal plate 5, for example. A cross-sectional view corresponding to the other penetration hole 55 of the metal plate 5 may also be molded using substantially the same method. In an embodiment, the die 8 may include a fixing-side plate (top clamping plate) 81, a runner stripper plate 82, a first template 83, a cavity block 84, a second template 85, a core block 86, a spacer block 87, an installation plate 88, a plurality of ejector pins 89 and/or a guide pin 90.

The fixing-side plate 81 may be a plate for attaching the fixed-side part of the die 8 to a fixing plate (e.g., a fixing die) of a die plate of a catapult, for example. The runner stripper plate 82 may be disposed between the fixing-side plate 81 and the first template 83, for example, and may function to pull out a sprue within a sprue bush 801 when the die 8 is open after injection. When the die 8 is open after injection, the runner stripper plate 82 may separate a product and resin remaining within a runner from the die 8. In an embodiment, a structure including the fixing-side plate 81 and the runner stripper plate 82 may include a runner system for making better the flowability of resin and reducing a molding fault (e.g., a weld line, insufficient charging, a flow mark, jetting, a sink mark, a silver streak, or bending/change (warpage)), for example. The runner system may include a hot runner and/or a cold runner, for example. The runner system can reduce the degradation of the fluidity of melt resin attributable to cooling resulting from a surrounding environment when the melt resin flows from a catapult cylinder to a molding space. The structure including the fixing-side plate 81 and the runner stripper plate 82 may include the sprue bush 801, runners 802 and/or gates 803. The sprue bush 801 may be an inlet device through which melt resin is injected. The runners 802 may be flow paths between the sprue bush 801 and a molding space. The gates 803 may be inlets which enable melt resin to flow from the runners 802 to the molding space. Upon injection molding, melt resin may be introduced into the molding space via the sprue bush 801, the runners 802, and the gates 803. Locations, the number, or forms of the sprue bushes, gates or runners are not limited to the illustrated example and may be various. The first template 83 may be disposed between the runner stripper plate 82 and the second template 85. The first template (e.g., an upper core plate or a cavity plate) 83 may be a die base in which the cavity block 84 is disposed. The cavity block 84 may provide at least a part of a cavity into which melt resin can flow. In an embodiment, the first template 83 may be implemented as a structure including at least a part of the cavity by replacing the cavity block 84. The second template (e.g., a lower core plate or a core plate) 85 may be a die base in which the core block 86 is disposed. The core block 86, together with the cavity block 84, may form the molding space for a shape of an external appearance of the back cover 320 (refer to FIG. 4). The spacer block 87 may be disposed between the second template 85 and the installation plate 88.

The spacer block 87 may include a space in which a second movable part 891 connected to the plurality of ejector pins 89 is movable. The plurality of ejector pins 89 may be disposed through a hole provided in the second template 85 and a hole provided in the core block 86. When a product is extracted in the state in which the die 8 has been open, the second movable part 891 (e.g., an actuator or a transfer device including a driving part, such as a hydraulic cylinder or a solenoid) may be moved in a −z axis direction while compressing a compression spring, for example. The plurality of ejector pins 89 may protrude with respect to the core block 86, and may separate a product from the core block 86 by pushing the product. The installation plate (e.g., a bottom clamping plate) 88 may be a plate for attaching a movable-side part (e.g., the second template 85, the spacer block 87) of the die 8 to a moving plate (e.g., a moving die) of the die plate of the catapult.

According to an embodiment, the guide pin 90 may be disposed through the hole provided in the second template 85 and the hole provided in the core block 86. The spacer block 87 may include a space in which a first movable part 901 connected to the guide pin 90 is movable. The first movable part 901 may be implemented using various methods, such as a hydraulic, pneumatic, electric, or power transmission structure, and may deliver power to the guide pin 90. For example, the first movable part 901 may include an actuator or a transfer device including a driving part, such as a hydraulic cylinder or a solenoid.

With reference to FIG. 7, in an embodiment, in operation 701, the metal plate 5 (refer to FIG. 5) including the plurality of penetration holes 54 and 55 for guiding the location of the metal plate 5 within the die 8 may be molded. For example, the metal plate 5 may be molded using various processing methods, such as computer numerical control (CNC), die casting or pressing.

Figure 9:
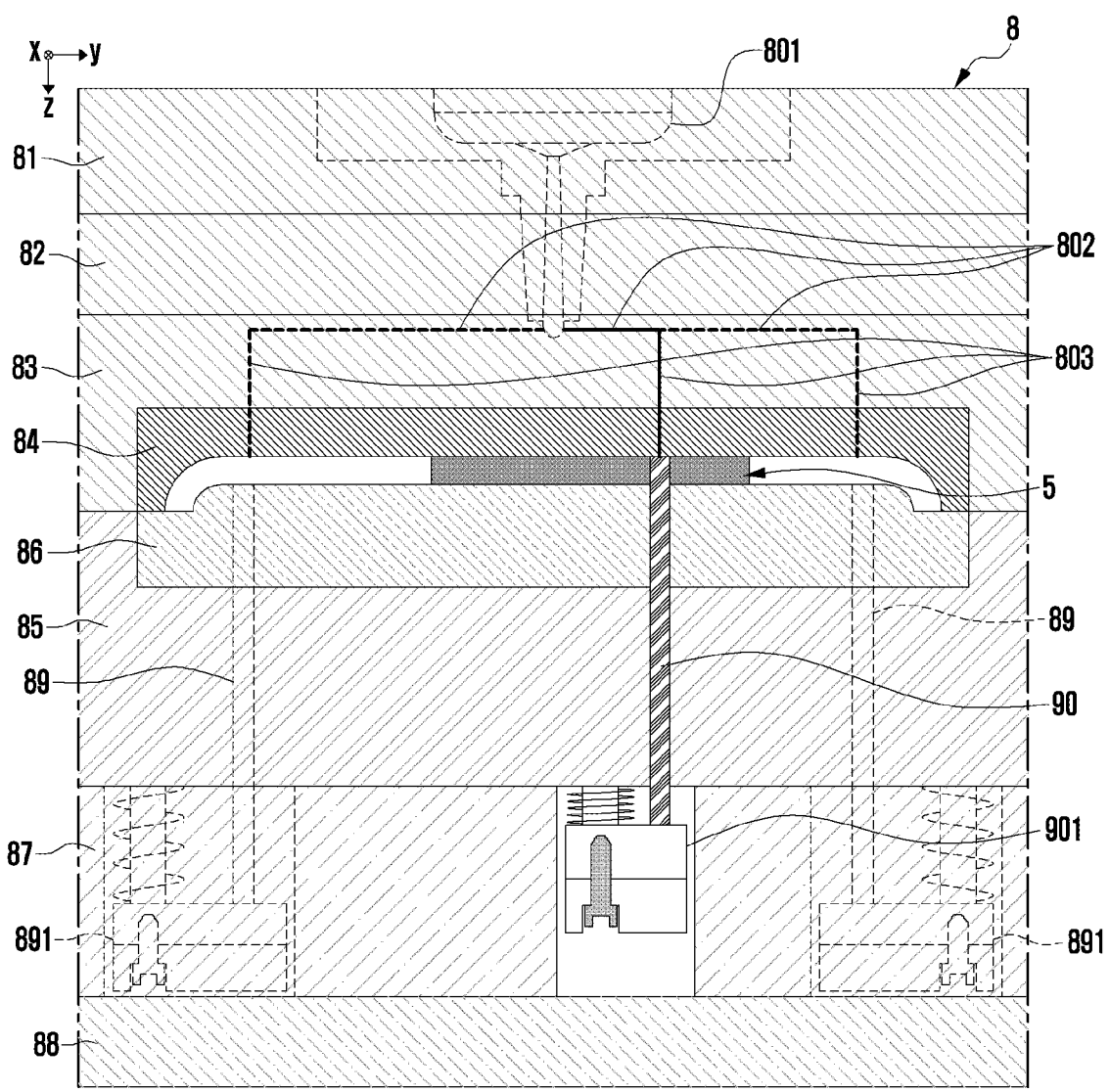
Figure 10:
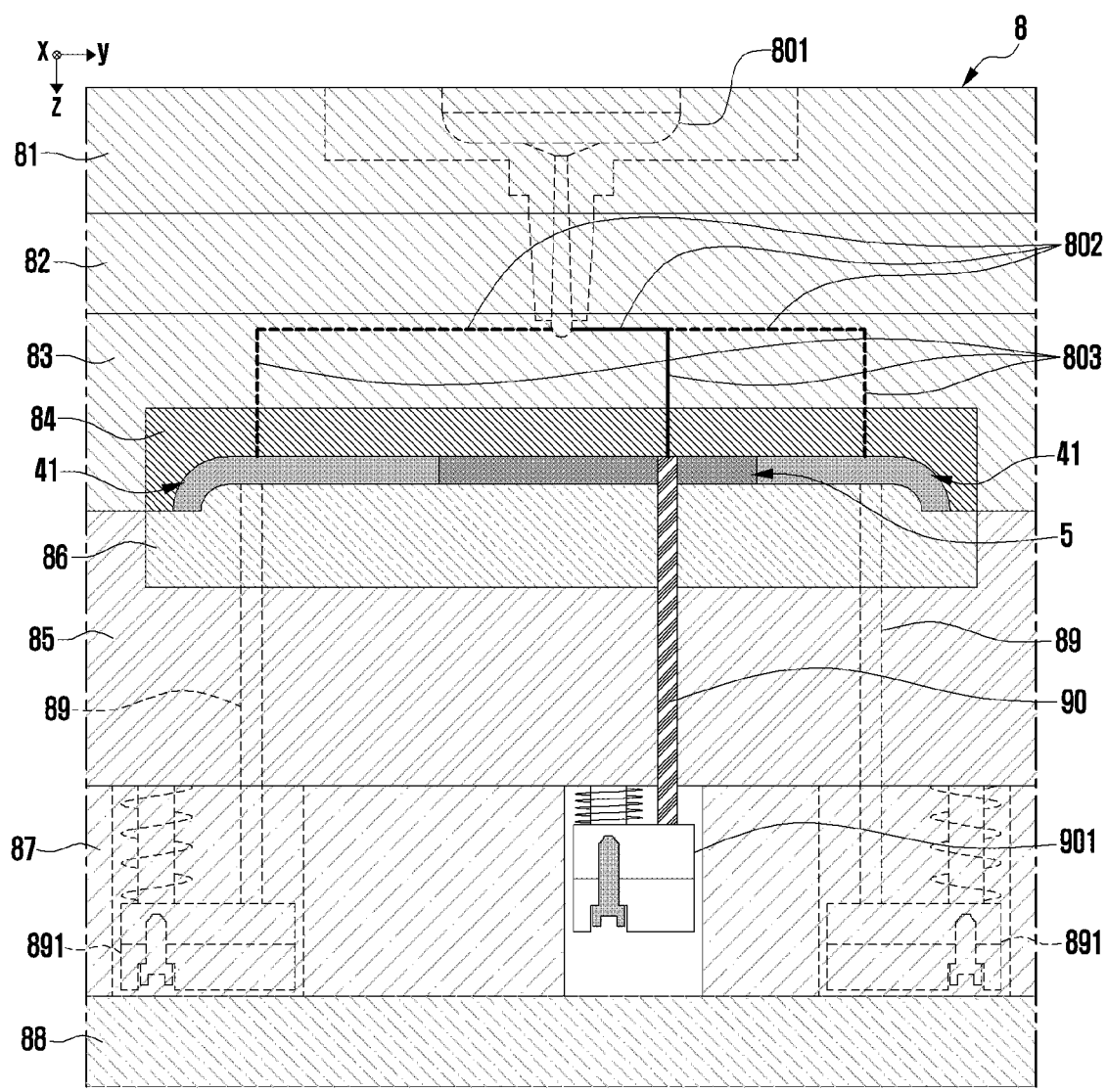

According to an embodiment, in operation 703, the first nonmetallic part 41 (refer to FIG. 4) combined with the metal plate 5 may be molded. When the die 8 switches from a closed state to an open state (refer to FIG. 8), the first movable part 901 may be moved in the −z axis direction with respect to the second template 85 and the core block 86 while compressing the compression spring, so that the guide pin 90 may protrude with respect to the core block 86. In the state in which the die 8 is open, the plurality of penetration holes 54 and 55 (refer to FIGS. 5 and 8) may penetrate the guide pin 90, so that the metal plate 5 may be disposed on the core block 86. The guide pin 90 and the penetration holes 54 and 55 of the metal plate 5 corresponding to the guide pin 90 may contribute to the metal plate 5 so that the metal plate 5 is stably disposed at a designated location on the die 8. In an embodiment, each of the plurality of penetration holes 54 and 55 may be a circle having a radius as illustrated in FIG. 5. The guide pin 90 may have a circular cylinder form corresponding to the circle. In an embodiment, although not illustrated, the plurality of penetration holes 54 and 55 may be provided as an oval shape or a polygon (e.g., a triangular shape or a rectangular shape). The guide pin 90 may be implemented as a cylinder having a cross-sectional form and corresponding to the oval shape or polygon. In an embodiment, the die 8 may include a limit switch used to determine a moving location of the first movable part 901 or a moving location of the guide pin 90. A control circuit electrically connected to the die 8 may control an operation of the first movable part 901 based on a contact signal generated from the limit switch. After an operation (e.g., insert) of disposing the metal plate 5 in the die 8, primary injection molding (or first molding) may be performed. With reference to FIGS. 9 and 10, in the primary injection molding, the die 8 may switch from the open state to the closed state. Melt resin may be injected into the molding space within the die 8. In the primary injection molding, the melt resin injected into the molding space may be solidified by circulating a coolant, so that the first nonmetallic part 41 combined with the metal plate 5 may be molded.

Figure 11:
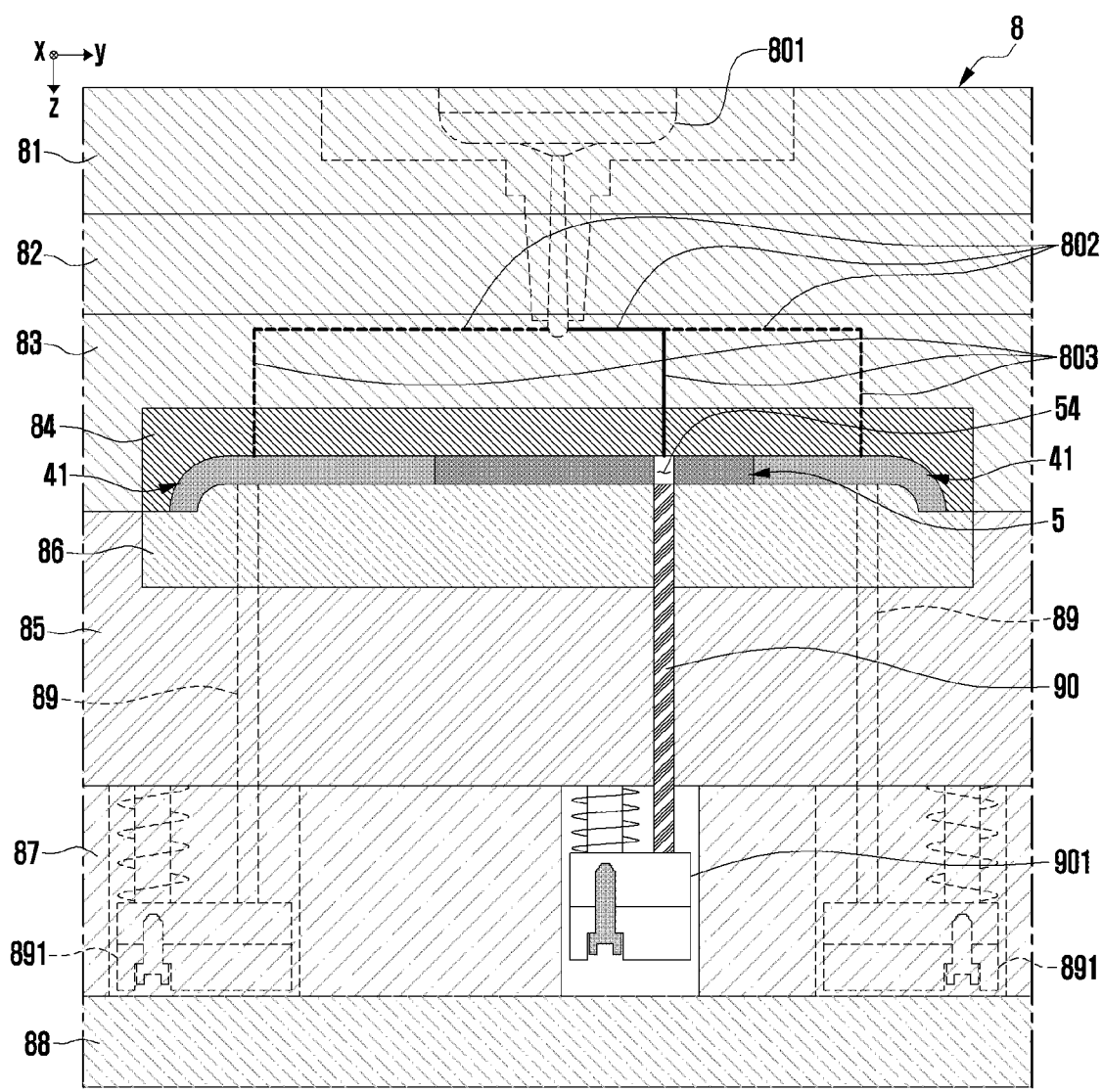
Figure 12:
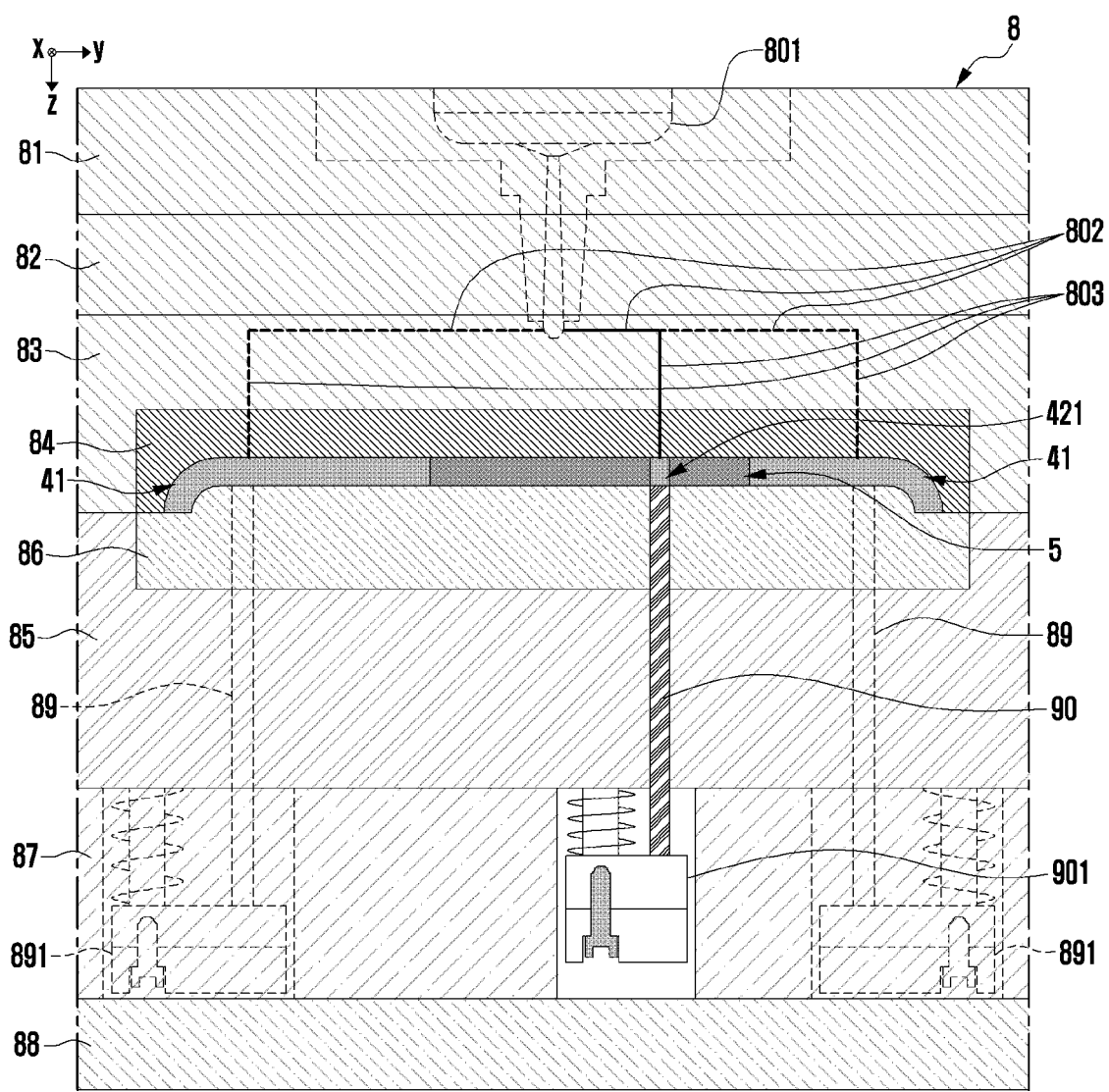

According to an embodiment, in operation 705, the second nonmetallic part 42 (refer to FIG. 4) at least partially disposed (or filled) in the plurality of penetration holes 54 and 55 (refer to FIG. 5) of the metal plate 5 may be molded. After the primary injection molding, secondary injection molding (or second molding) may be performed. With reference to FIGS. 10 and 11, in the secondary injection molding, the first movable part 901 may be moved in a +z axis direction using an elastic restoring force of the compression spring, so that the guide pin 90 may not be disposed in at least a part of the penetration hole 54 of the metal plate 5. With reference to FIGS. 11 and 12, in the secondary injection molding, melt resin may be injected into the penetration hole 55. In the secondary injection molding, the melt resin may be solidified by circulating a coolant, so that the first part 421 of the second nonmetallic part 42 combined with the metal plate 5 may be molded. In the secondary injection molding, the second part 422 (refer to FIG. 4) of the second nonmetallic part 42 may be molded using the same method.

Figure 13:
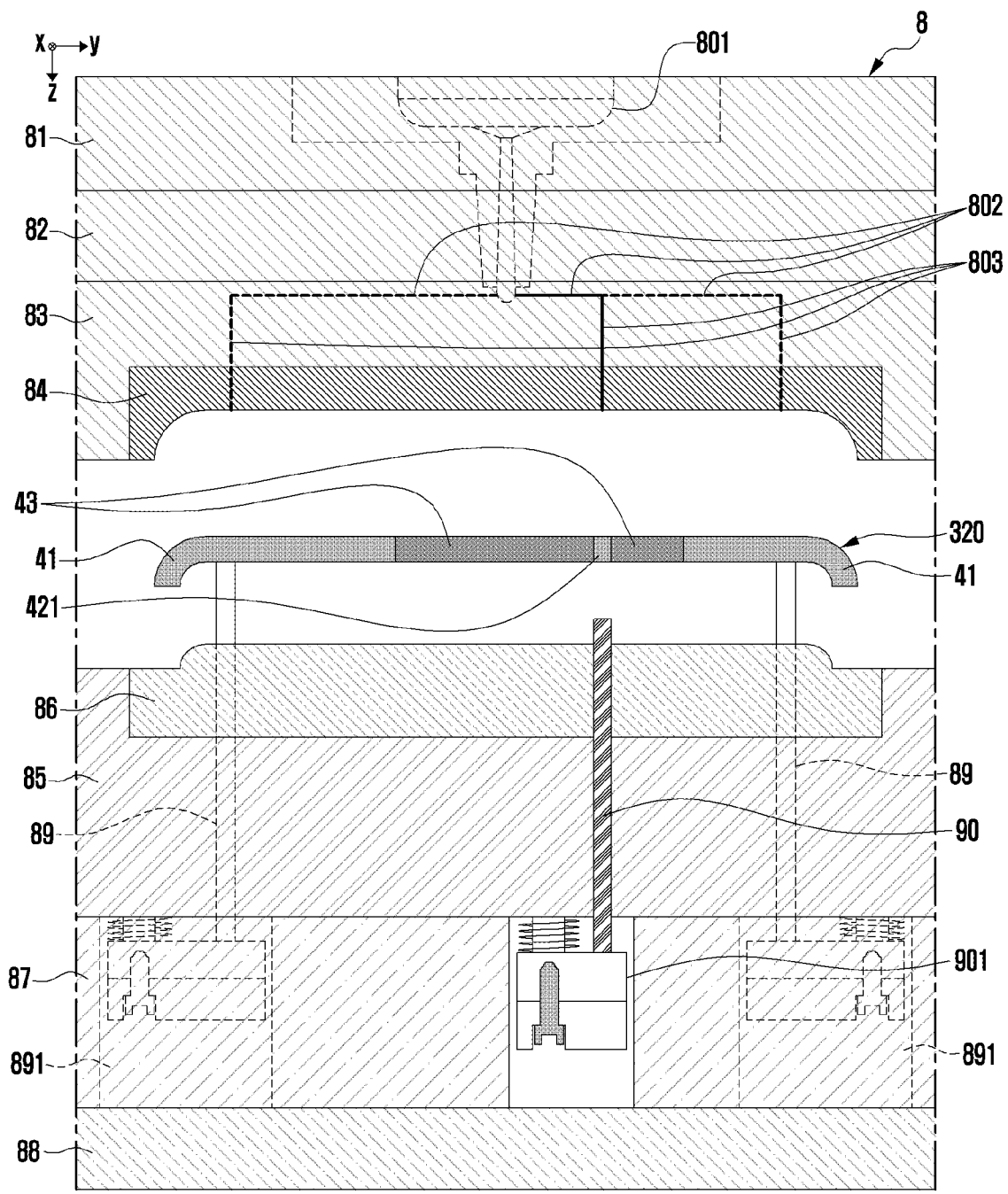

According to an embodiment, in operation 707, extraction may be performed. With reference to FIGS. 12 and 13, the die 8 may switch from the closed state to the open state. In the state in which the die 8 has been open, the second movable part 891 may be moved in the −z axis direction while compressing the compression spring. The plurality of ejector pins 89 may separate the back cover 320 from the core block 86 by pushing the back cover 320. When the die 8 switches from the closed state to the open state, the guide pin 90 may protrude with respect to the core block 86 in order to guide the metal plate 5 so that the metal plate 5 is disposed at a designated location on the die 8. In an embodiment, after the extraction, an operation of removing a part molded due to the runners 802 and/or the gates 803 may be performed. In an embodiment, the manufacturing flow 700 may further include post-processing (e.g., surface processing) for the back cover 320 after the extraction.

Figure 14:
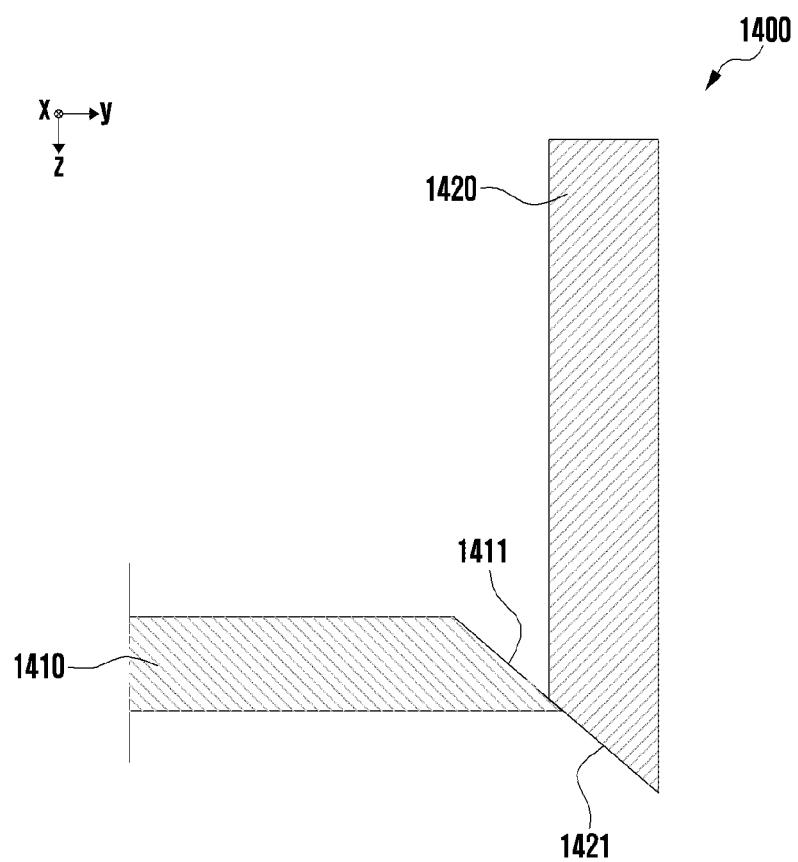
FIG. 14 is a cross-sectional view illustrating a link structure for a movement of a guide pin in the die according to various embodiments.

FIG. 14 is cross-sectional view 1400 illustrating a link structure for a movement of the guide pin 90 in the die 8 according to various embodiments.

With reference to FIG. 14, in an embodiment, the link structure may include a first link 1410 and a second link 1420. The second link 1420 may include the guide pin 90 in FIG. 8 or may be combined with the guide pin 90, for example. When the first link 1410 is moved in a first direction (e.g., a +y axis direction), the second link 1420 may be moved in a second direction (e.g., a −z axis direction) not parallel to the first direction. In an embodiment, the first link 1410 may include a first incline part 1411. The second link 1420 may include a second incline part 1421 corresponding to the first incline part 1411. Due to an interaction using friction between the first incline part 1411 and the second incline part 1421, a first rectilineal movement (or a first translation motion) by which the first link 1410 is moved in the first direction may be converted into a second rectilineal movement (or a second translation motion) by which the second link 1420 is moved in the second direction. In an embodiment, the first incline part 1411 and the second incline part 1421 may have an incline surface having the same tilt angle at which the first incline part 1411 and the second incline part 1421 correspond to each other in a way to be brought into contact with each other. Due to an interaction between the first incline part 1411 and the second incline part 1421 attributable to the tilt angle of the first incline part 1411 and the tilt angle of the second incline part 1421, the first rectilineal movement by which the first link 1410 is moved in the first direction may be converted into the second rectilineal movement by which the second link 1420 is moved in the second direction. In an embodiment, the occurrence of friction noise or the occurrence of dust can be reduced because the first incline part 1411 and the second incline part 1421 have the incline surface having the same tilt angle at which the first incline part 1411 and the second incline part 1421 correspond to each other in a way to be brought into contact with each other. In an embodiment (not illustrated), the second incline part 1421 may be implemented as a structure in which an end having a curved part form or a rotation member, such as a roller, is rotatably disposed in accordance with the first incline part 1411. In an embodiment, in order to reduce a friction force between the first incline part 1411 and the second incline part 1421, a lubricant (e.g., grease) may be interposed between the first incline part 1411 and the second incline part 1421. In an embodiment, in order to reduce a friction force between the first incline part 1411 and the second incline part 1421, a surface of the first incline part 1411 and/or a surface of the second incline part 1421 may be coated using a lubricant.

According to an embodiment, the die 8 may include an actuator (not illustrated) connected to the first link 1410. The actuator (e.g., a hydraulic cylinder or a solenoid) may output power that enables the first link 1410 to be moved in the first direction. In an embodiment, the actuator may be implemented to directly move the second link 1420 in the second direction (e.g., the +y axis direction) without the first link 1410.

Figure 15:
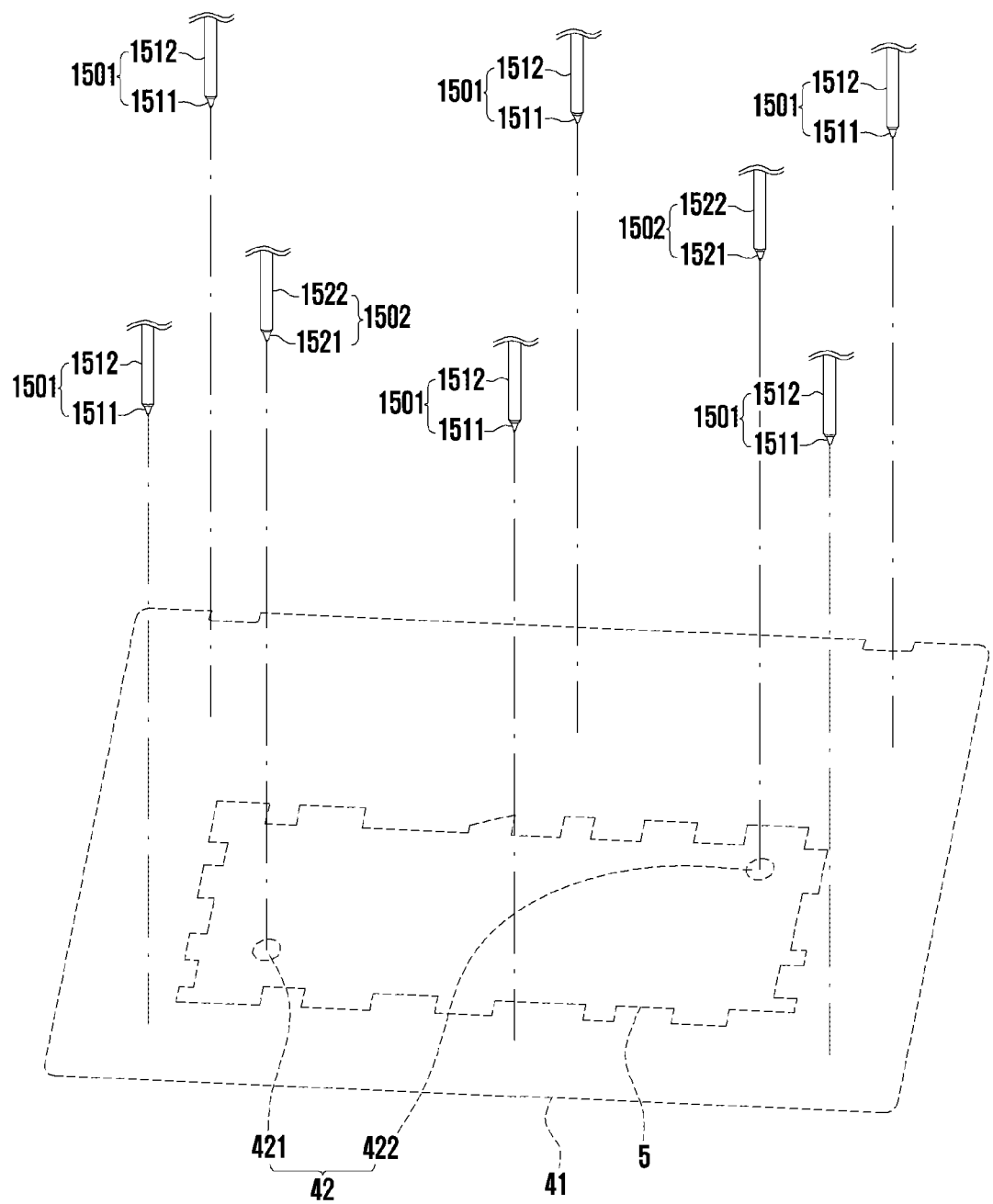
FIG. 15 is a diagram illustrating a plurality of first filling flow systems and a plurality of second filling flow systems included in the die according to various embodiments.

FIG. 15 is a diagram illustrating a plurality of first filling flow systems 1501 and a plurality of second filling flow systems 1502 included in the die 8 according to various embodiments.

With reference to FIG. 15, in an embodiment, each of the plurality of first filling flow systems 1501 may include a first gate 1511 and a first runner 1512. Each of the plurality of second filling flow systems 1502 may include a second gate 1521 and a second runner 1522. The plurality of first filling flow systems 1501 may be used for primary injection molding for forming the first nonmetallic part 41. The plurality of second filling flow systems 1502 may be used for secondary injection molding for forming the second nonmetallic part 42. In an embodiment, the first gate 1511 and the second gate 1521 each may include a valve gate. In the primary injection molding (e.g., operation 703 in FIG. 7), a valve of the first gate 1511 among the first gate 1511 and the second gate 1521 may be open, so that the first gate 1511 may be in the state in which melt resin can be injected. In an embodiment, in the secondary injection molding (e.g., operation 705 in FIG. 7), a valve of the second gate 1521 among the first gate 1511 and the second gate 1521 may be open, so that the second gate 1521 may be in the state in which melt resin can be injected.

According to an embodiment, the first gate 1511 or the second gate 1521 may include a pin point gate. The first gate 1511 or the second gate 1521 is not limited to the illustrated example, and may be implemented as a gate having various other locations or forms, which can reduce an injection fault for the back cover 320.

According to an embodiment, the first gate 1511 may be implemented in a side gate form. The first gate 1511 may be disposed aside an injection molding space, for example. In an embodiment, the first gate 1511 may be disposed in a die parting line. The first gate 1511 may be disposed aside the molding space on the die parting line, for example. The die parting line may indicate a part where the first template 83 (refer to FIG. 13) and the second template 85 (refer to FIG. 13) are split so that the back cover 320 may be extracted by opening the die 8. A structure in which the first gate 1511 is disposed in the die parting line prevents or avoids the die 8 from having a trapping structure, such as an undercut, and may contribute to the back cover 320 having a thin plate form including the plane part P and a curved part (e.g., the first curved part C1, the second curved part C2, the third curved part C3 and/or the fourth curved part C4 in FIG. 4) so that the back cover 320 can be easily extracted from the die 8 without being damaged.

Figure 16:
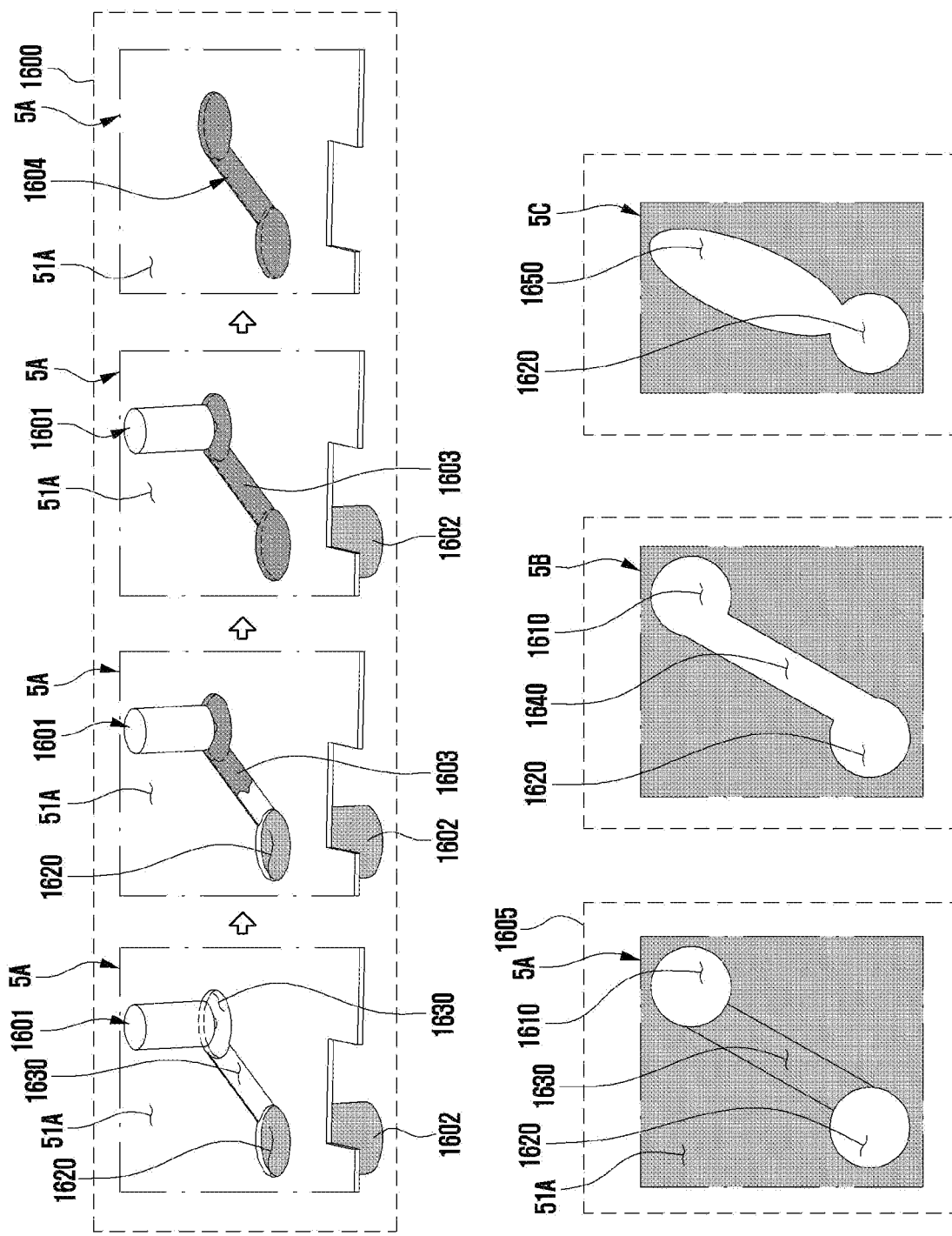
FIG. 16 is a diagram illustrating an example metal plate according to various embodiments.

FIG. 16 is a diagram illustrating an example metal plate according to various embodiments.

With reference to FIG. 16, reference numeral "1600" illustrates an example operating flow of secondary injection molding (e.g., operation 705 in FIG. 7) according to an embodiment. Reference numeral "1605" is a plan view about a metal plate 5A when viewed from the top of one surface 51A (e.g., the one surface 51 in FIG. 5). The metal plate 5 in FIG. 5, 8, or 15 may be substituted with the metal plate 5A in FIG. 16. The die 8 in FIG. 8 may be modified and implemented in a form corresponding to the metal plate 5A. The metal plate 5A may include a first penetration hole 1610 corresponding to a gate 1601 (e.g., the second gate 1521 in FIG. 15) for secondary injection molding (e.g., operation 705 in FIG. 7), a second penetration hole 1620 (e.g., the penetration hole 54 or 55 in FIG. 5) corresponding to a guide pin 1602 (e.g., the guide pin 90 in FIG. 8), and a recess 1630 that connects the first penetration hole 1610 and the second penetration hole 1620 and that is provided in the one surface 51A, for example. In the secondary injection molding, melt resin 1603 may be injected through the gate 1601 disposed in accordance with the first penetration hole 1610. The melt resin 1603 may be filled into the first penetration hole 1610, the recess 1630, and the second penetration hole 1620. The recess 1630 may play a role as a runner. A nonmetallic part 1604 disposed in the first penetration hole 1610, the recess 1630, and the second penetration hole 1620 by the secondary injection molding may include a surface smoothly connected to the one surface 51A of the metal plate 5A.

According to an embodiment, the first penetration hole 1610, that is, a part where the melt resin is injected from the gate 1601, is not limited to the illustrated example, and may be provided in various other forms. For example, a recess may be provided instead of the first penetration hole 1610.

According to an embodiment, as in a metal plate indicated by reference numeral "5B", the recess 1630 may be modified and provided in the form of an opening 1640. In an embodiment, as in a metal plate indicated by reference numeral "5C", the recess 1630 may be modified and provided as an opening 1650 having an oval form, instead of the first penetration hole 1610 and the opening 1640 having a straight line form. A form of the opening 1650 is not limited to the illustrated oval form, and may be provided in various other forms.

Figure 17:
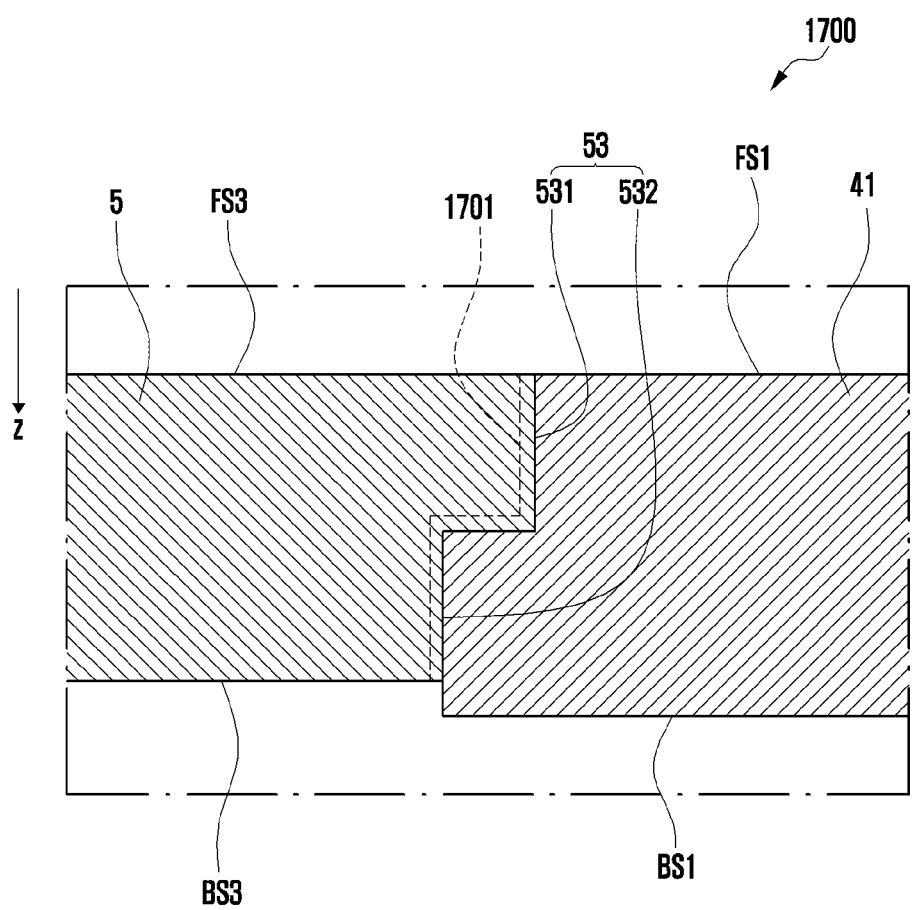
FIG. 17 is a cross-sectional view illustrating a combination structure between the metal plate and a first nonmetallic part according to various embodiments.

FIG. 17 is a cross-sectional view 1700 illustrating a combination structure between the metal plate 5 and the first nonmetallic part 41 according to various embodiments.

With reference to FIG. 17, in an embodiment, the side surface 53 of the metal plate 5 may include a stepped structure 1701. The side surface 53 may include a first area 531 and a second area 532. The stepped structure 1701 may indicate a form having a height difference between the first area 531 and the second area 532. The first area 531 may be closer to the second surface 102 (refer to FIG. 4) than the second area 532. The second area 532 may be closer to the fifth surface 107 (refer to FIG. 3) than the first area 531.

According to an embodiment, if the first nonmetallic part 41 is formed through primary injection molding, the stepped structure 1701 of the side surface 53 may contribute to the forming of a stable combination structure between the first nonmetallic part 41 and the metal plate 5. For example, the stepped structure 1701 of the side surface 53 can improve durability by which the first nonmetallic part 41 and the metal plate 5 are not separated from each other due to an external impact (e.g., an impact attributable to a drop), compared to a comparison example not including the stepped structure. In an embodiment, additionally or by replacing the stepped structure 1701, the side surface 53 may include a concave-convex surface including a plurality of dimples, a plurality of grooves and/or a plurality of recesses. In an embodiment, there may be provided a connection structure in which a part of the first nonmetallic part 41 is disposed in a plurality of dimples, a plurality of grooves or a plurality of recesses provided in the side surface 53 and is inserted into the metal plate 5. In an embodiment, the connection structure may be implemented as an entangling structure, such as a dovetail joint.

According to an embodiment, the stepped structure 1701 may contribute to the reduction of an injection fault in the back cover 320 having a thin plate form. The stepped structure 1701 can reduce an injection fault in primary injection so that a form in which the first front surface area FS1 and the third front surface area FS3 are smoothly connected can be provided, for example. The stepped structure 1701 may contribute to the concave-convex structure (refer to FIG. 5) of the side surface 53 so that upon primary injection molding, melt resin can flow into the side surface 53 without an empty place, compared to a comparison example not including the stepped structure 1701. The stepped structure 1701 can reduce a flash phenomenon in primary injection molding.

According to an embodiment, a nonmetallic part (e.g., the first nonmetallic part 41 or the second nonmetallic part 42) may include a nonmetallic material having bonding affinity with the metal plate 5.

Figure 18:
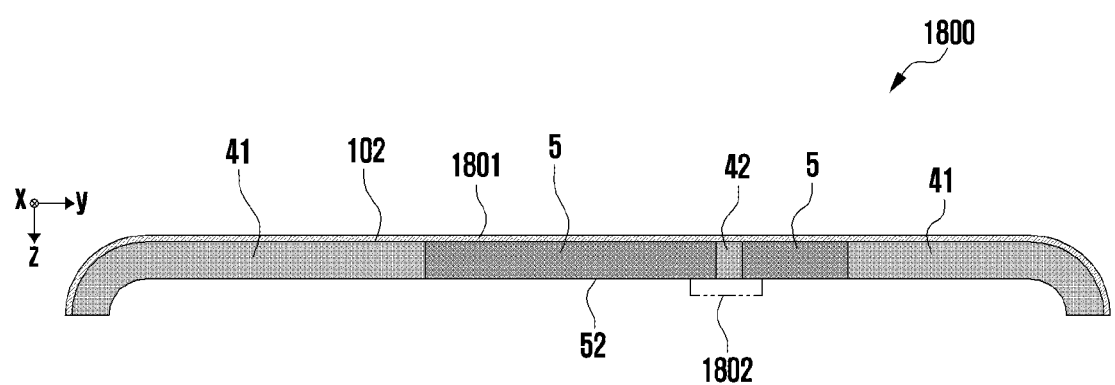
FIG. 18 is a cross-sectional view taken along the y-z plane of line A-A' in FIG. 4 according to various embodiments.

FIG. 18 is a cross-sectional view 1800 taken on the y-z plane along line A-A' in FIG. 4 according to various embodiments.

With reference to FIGS. 7 and 18, in an embodiment, the manufacturing flow 700 may further include post-processing (e.g., surface processing) for the back cover 320. The back cover 320 may further include a surface protection layer 1801 disposed in the second surface 102, for example. The surface protection layer 1801 may be formed using various methods, such as coating or film bonding. The surface protection layer 1801 may be a final layer for featly protecting the back cover 320 against the outside, for example. In an embodiment, the surface protection layer 1801 may make the first nonmetallic part 41, the second nonmetallic part 42, and the metal plate 5 visually not distinguished from one another. In an embodiment, an operation of removing a part subjected to injection molding due to a gate (e.g., the first gate 1511 or the second gate 1521 in FIG. 15) of the die 8 may be performed. A trace of the removed part may remain in the second surface 102 (refer to FIG. 4). The surface protection layer 1801 may make the trace substantially invisible. The surface protection layer 1801 may have various colors that are substantially opaque, for example. In an embodiment, the surface protection layer 1801 may include a metal material. In an embodiment, the surface protection layer 1801 may include a metal material different from that of the metal plate 5. In an embodiment, the back cover 320 may further include an adhesive material, such as a primer disposed between the second surface 102 and the surface protection layer 1801.

According to an embodiment, the second nonmetallic part 42 may be extended in a way to be combined with the one surface 52 of the metal plate 5 while partially facing the one surface 52, as in an alternate long and two short dashes line indicated by reference numeral "1802."

Figure 19:
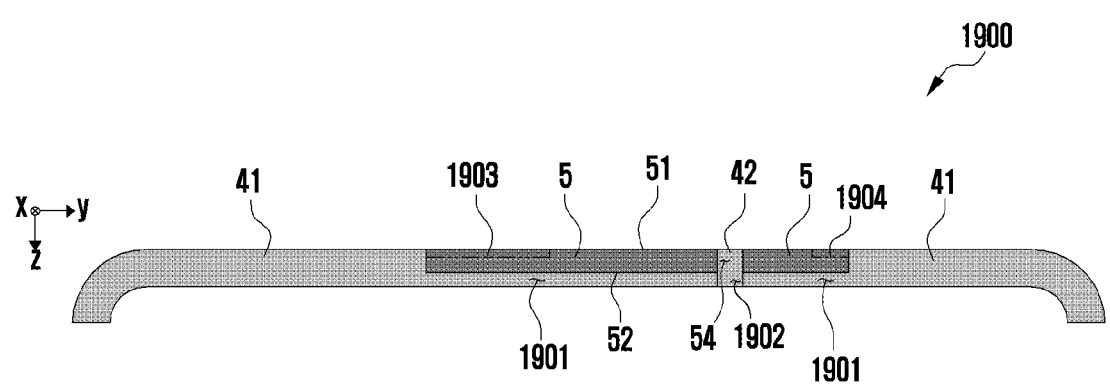
FIG. 19 is a cross-sectional view taken on the y-z plane of line A-A' in FIG. 4 according to various embodiments.

FIG. 19 is a cross-sectional view 1900 taken on the y-z plane along line A-A' in FIG. 4 according to various embodiments.

With reference to FIG. 19, in an embodiment, the first nonmetallic part 41 may further include an overlap part 1901 combined with the one surface 52 of the metal plate 5 while at least a part of the overlap part faces the one surface 52. In an embodiment, the overlap part 1901 may include a penetration hole 1902 aligned with the penetration hole 54 of the metal plate 5. The second nonmetallic part 42 may be disposed in the penetration hole 54 of the metal plate 5 and the penetration hole 1902 of the overlap part 1901.

According to an embodiment, the first nonmetallic part 41 may further include an overlap part combined with the one surface 51 of the metal plate 5 while partially facing the one surface 51, as in an alternate long and two short dashes line indicated by reference numeral "1903" or reference numeral "1904." The overlap part 1903 or 1904 may be disposed in the recess provided in the one surface 51 of the metal plate 5, and may be formed without a protrusion with respect to the metal plate 5.

According to an embodiment, in the cross-sectional view 6 in FIG. 6, the cross-sectional view 1800 in FIG. 18, or the cross-sectional view 1900 in FIG. 19, an organic adhesive material (not illustrated) may be disposed between the first nonmetallic part 41 and the metal plate 5 or between the second nonmetallic part 42 and the metal plate 5. For example, with reference to FIG. 8, the metal plate 5 may be disposed in the die 8 after an organic adhesive material is disposed. The organic adhesive material may contribute to (e.g., TRI bonding) the metal plate 5 and a nonmetallic part (e.g., the first nonmetallic part 41 and/or the second nonmetallic part 42) in a way to be strongly and closely combined. Combination durability between the metal plate 5 and a nonmetallic part (e.g., the first nonmetallic part 41 and/or the second nonmetallic part 42) attributable to the organic adhesive material may contribute to a waterproof function. The organic adhesive material may include various polymers or sealants, such as a triazine thiol, dithio pyrimidine, or silane-based compound, for example.

According to an embodiment, the first nonmetallic part 41 and the second nonmetallic part 42 may be integrated and formed. For example, the first nonmetallic part 41 may be injected and the second nonmetallic part 42 may be injected and then fused together.

Figure 20:
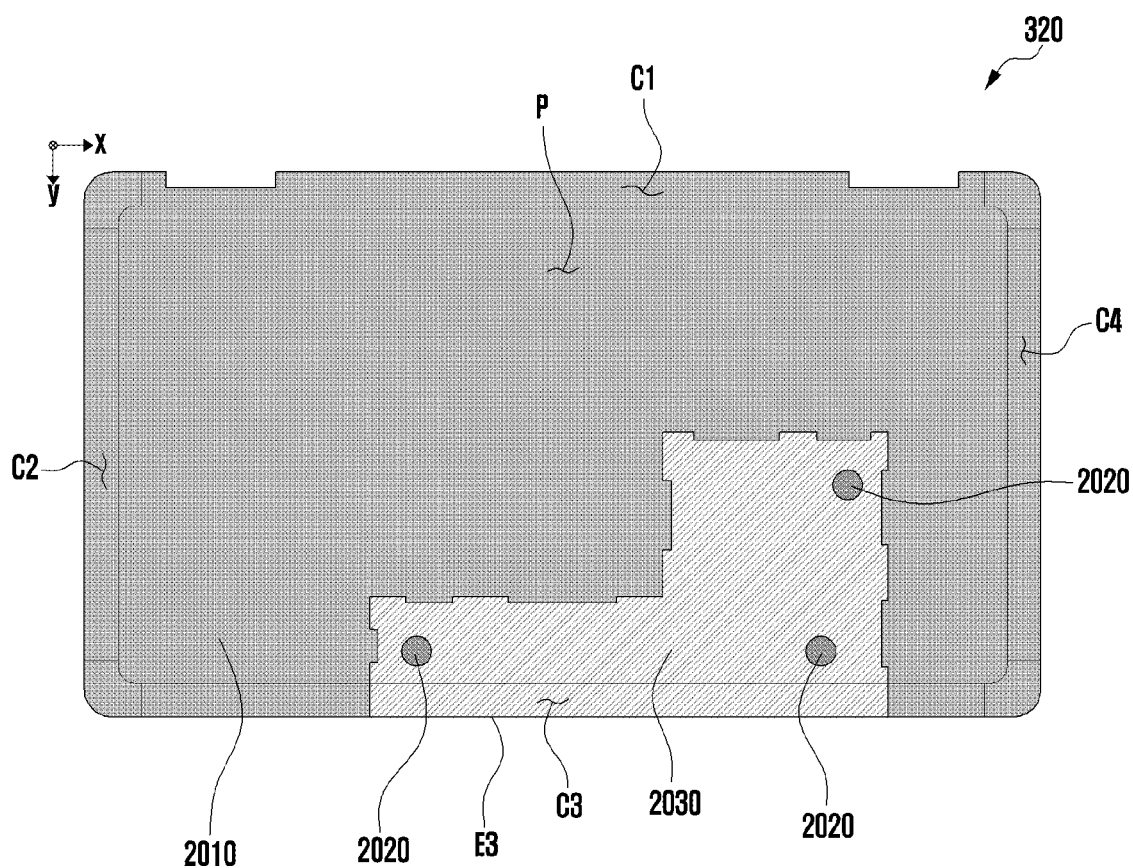
FIG. 20 is a diagram illustrating an x-y plane of the back cover according to various embodiments.

FIG. 20 is a diagram illustrating an example back cover 320 according to various embodiments.

With reference to FIG. 20, the back cover 320 may include a first nonmetallic part 2010, a second nonmetallic part 2020, and a metal plate 2030, for example. The metal plate 2030 may be formed using substantially the same method as that of the metal plate 5 in FIG. 4. The first nonmetallic part 2010 may be formed using substantially the same method as that of the first nonmetallic part 41 in FIG. 4. The second nonmetallic part 2020 may be formed using substantially the same method as that of the second nonmetallic part 42 in FIG. 4. At least a part of the second nonmetallic part 2020 may be disposed (or filled) in one or more penetration holes (or one or more guide holes) of the metal plate 2030. In an embodiment, the metal plate 2030 may be extended to the third curved part C3, and may provide a part of the third edge E3. In an embodiment, the metal plate 2030 may be extended to the first curved part C1, the second curved part C2, or the fourth curved part C4.

According to an embodiment, the metal plate 2030 may not be disposed in the plane part P, and may be disposed in a curved part (e.g., the first curved part C1, the second curved part C2, or the fourth curved part C4). In this case, the second nonmetallic part 2020 may be disposed in the curved part of the back cover 320.

Figure 21:
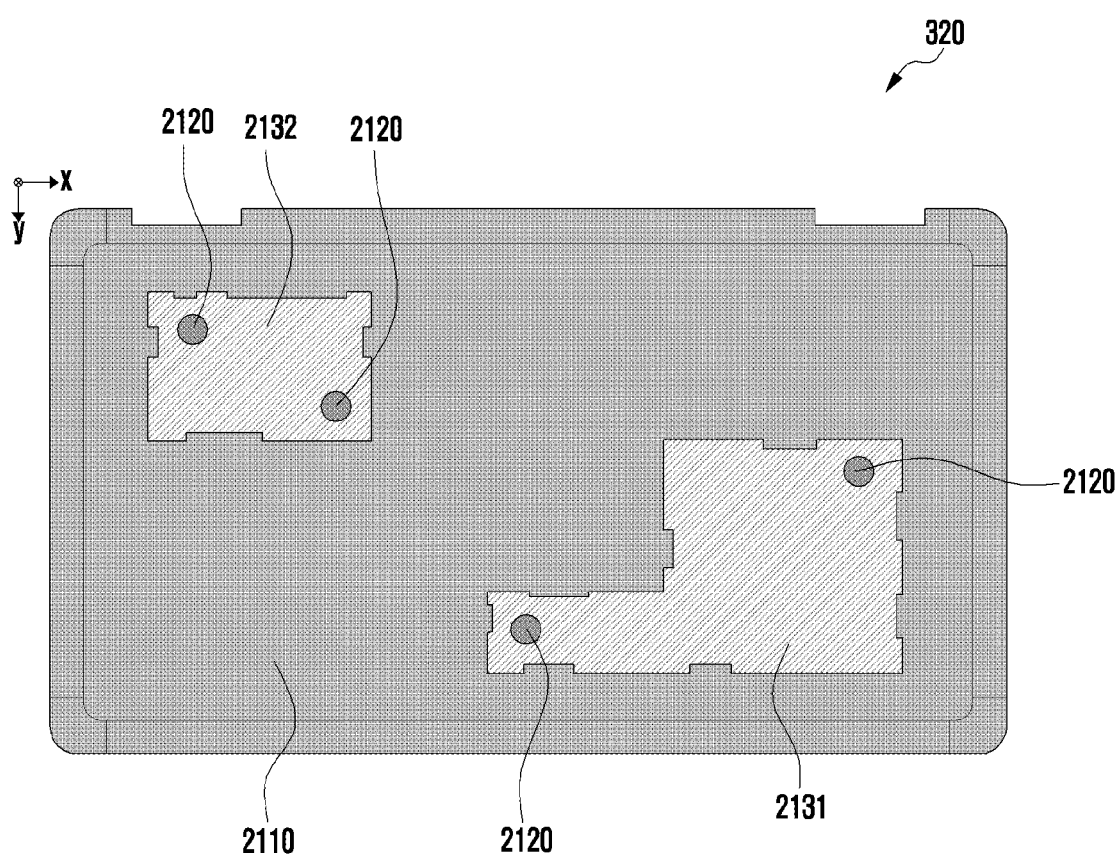
FIG. 21 is a diagram illustrating an x-y plane of the back cover according to various embodiments.

FIG. 21 is a diagram illustrating an example back cover 320 according to various embodiments.

With reference to FIG. 21, the back cover 320 may include a first nonmetallic part 2110, a second nonmetallic part 2120, a first metal plate 2131 and/or a second metal plate 2132, for example. The first metal plate 2131 or the second metal plate 2132 may be formed using substantially the same method as that of the metal plate 5 in FIG. 4. The first nonmetallic part 2110 may be formed using substantially the same method as that of the first nonmetallic part 41 in FIG. 4. The second nonmetallic part 2120 may be formed using substantially the same method as that of the second nonmetallic part 42 in FIG. 4. In an embodiment, the first metal plate 2131 and the second metal plate 2132 combined with the first nonmetallic part 2110 may be physically separated from each other. At least a part of the second nonmetallic part 2120 may be disposed (or filled) in one or more first penetration holes (or one or more first guide holes) of the first metal plate 2131, and may be disposed (or filled) in one or more second penetration holes (or one or more second guide holes) of the second metal plate 2132. In an embodiment, the number or locations of metal plates included in the back cover 320 is not limited to the illustrated example and may be various.

According to an embodiment, at least a part of the case 310 (refer to FIG. 3) included in the first housing 111 or at least a part of the second housing 112 (refer to FIG. 1) may be formed in a thin plate form using the manufacturing flow 700 of FIG. 7. In an embodiment, a housing having a thin plate form included in an electronic device having various other forms without being limited to the electronic device 1 illustrated in FIG. 1 may be implemented using the manufacturing flow 700 of FIG. 7.

According to an example embodiment of the disclosure, an electronic device (e.g., the electronic device 1 in FIG. 1) may include: a housing (e.g., the back cover 320 in FIG. 4) providing one surface (e.g., the second surface 102 in FIG. 2) of the device. The housing may include: a metal plate (e.g., the metal plate 5 in FIG. 4) including at least one penetration hole (e.g., the plurality of penetration holes 54 and 55 in FIG. 5). The housing may include: a first nonmetallic part (e.g., the first nonmetallic part 41 in FIG. 4) combined with the metal plate. The first nonmetallic part may surround at least a part of the side surface of the metal plate. The housing may include: a second nonmetallic part (e.g., the second nonmetallic part 42 in FIG. 4) at least partially disposed in the at least one penetration hole. The second nonmetallic part may provide a part of the one surface.

Figure 8:
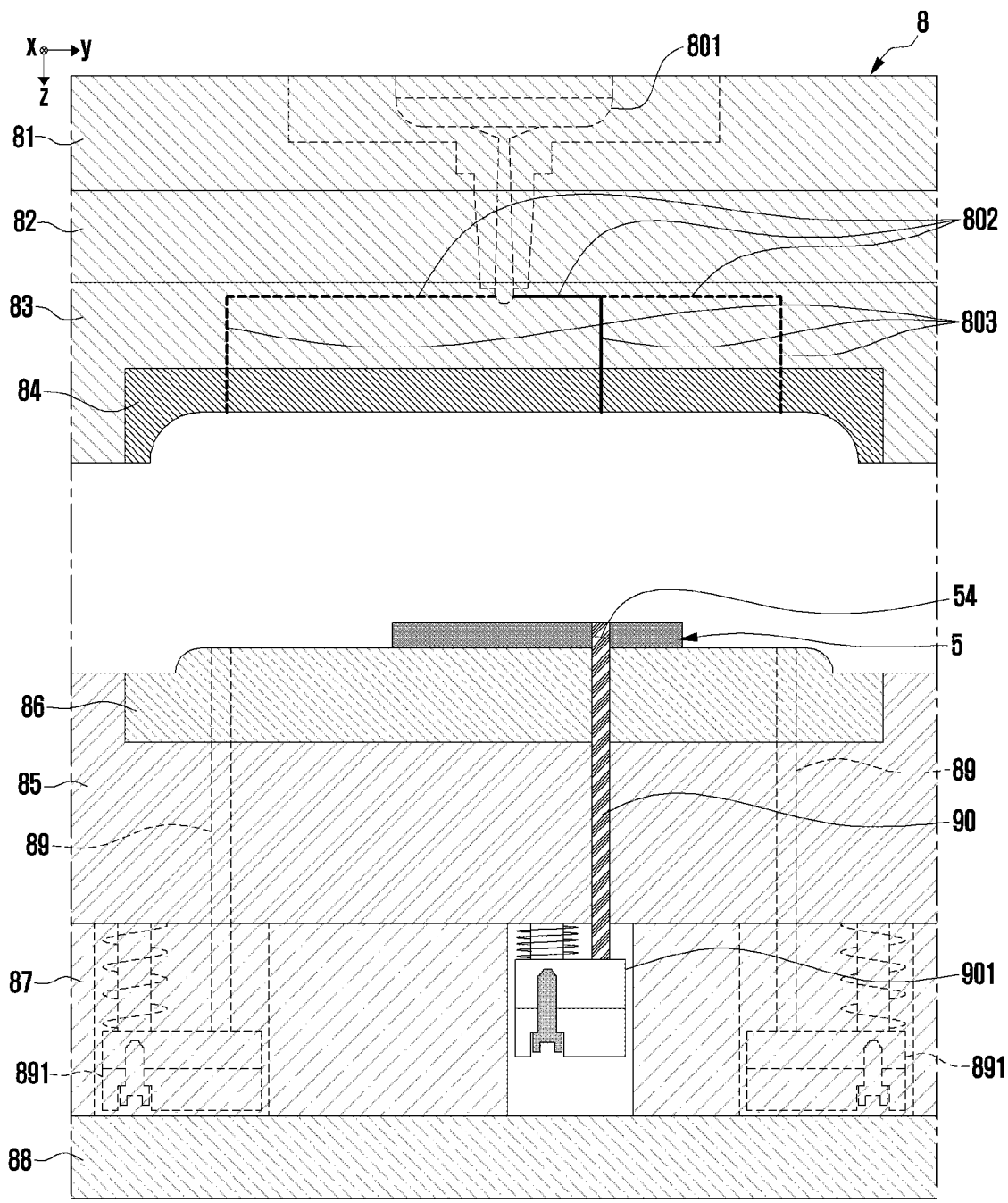
FIGS. 8, 9, 10, 11, 12, and 13 are cross-sectional views illustrating a die for an operation in relation to the manufacturing flowchart of FIG. 7 according to various embodiments.

According to an example embodiment of the disclosure, the first nonmetallic part (e.g., the first nonmetallic part 41 in FIG. 4) and the second nonmetallic part (e.g., the second nonmetallic part 42 in FIG. 4) may be formed using a die (e.g., the die 8 in FIG. 8). The at least one penetration hole (e.g., the plurality of penetration holes 54 and 55 in FIG. 5) may be configured to guide a location where the metal plate (e.g., the metal plate 5 in FIG. 8) is disposed within the die.

According to an example embodiment of the disclosure, the side surface (e.g., the side surface 53 in FIG. 5) may include a concave-convex structure including a plurality of notches, when viewed from the top of the one surface (e.g., the second surface 102 in FIG. 4) of the housing (e.g., the back cover 320 in FIG. 4).

According to an example embodiment of the disclosure, the side surface (e.g., the side surface 53 in FIG. 17) of the metal plate may include a first area (e.g., the first area 531 in FIG. 17) and a second area (e.g., the second area 532 in FIG. 17). The first area may be closer to the one surface of the housing (e.g., the second surface 102 in FIG. 4) than the second area. A step (e.g., the stepped structure 1701 in FIG. 17) may be included between the first area and the second area.

According to an example embodiment of the disclosure, the one surface (e.g., the second surface 102 in FIG. 4) of the housing may include an area (e.g., the first front surface area FS1 in FIG. 4) defined by the first nonmetallic part, an area (e.g., the second front surface area FS2 in FIG. 4) defined by the second nonmetallic part, and an area (e.g., the third front surface area FS3 in FIG. 4) defined by the metal plate.

According to an example embodiment of the disclosure, when viewed from the top of the one surface of the housing, the first nonmetallic part (e.g., the first nonmetallic part 41 in FIG. 19) may further include a part (e.g., the overlap part 1901 in FIG. 19) overlapping the metal plate (e.g., the metal plate 5 in FIG. 19).

According to an example embodiment of the disclosure, an edge (e.g., the first edge E1, the second edge E2, the third edge E3, or the fourth edge E4 in FIG. 4) of the housing may be provided by the first nonmetallic part (e.g., the first nonmetallic part 41 in FIG. 4).

According to an example embodiment of the disclosure, a part of an edge (e.g., the third edge E3 in FIG. 20) of the housing may be provided by the first nonmetallic part (e.g., the first nonmetallic part 2010 in FIG. 20). Another part of the edge may be provided by the metal plate (e.g., the metal plate 2030 in FIG. 20).

According to an example embodiment of the disclosure, the housing may include a plane part (e.g., the plane part P in FIG. 4) and a curved part (e.g., the first curved part C1, the second curved part C2, the third curved part C3, or the fourth curved part C4 in FIG. 4) surrounding at least a part of the plane part.

According to an example embodiment of the disclosure, the metal plate (e.g., the metal plate 5 in FIG. 4) may be disposed in the plane part (e.g., the plane part P in FIG. 4).

According to an example embodiment of the disclosure, the metal plate (e.g., the metal plate 2030 in FIG. 20) may extend from the plane part (e.g., the plane part P in FIG. 20) to the curved part (e.g., the third curved part C3 in FIG. 20).

According to an example embodiment of the disclosure, the first nonmetallic part (e.g., the first curved part C1 in FIG. 4) and the second nonmetallic part (e.g., the second nonmetallic part 42 in FIG. 4) may include the same nonmetallic material.

According to an example embodiment of the disclosure, the first nonmetallic part (e.g., the first curved part C1 in FIG. 4) and the second nonmetallic part (e.g., the second nonmetallic part 42 in FIG. 4) may include different nonmetallic materials.

According to an example embodiment of the disclosure, the housing may include at least a part (e.g., the back cover 320 in FIG. 3) of a foldable housing (e.g., the foldable housing 11 in FIG. 1).

According to an example embodiment of the disclosure, the housing (e.g., the back cover 320 in FIG. 4) may have a thickness in a range of 1 mm to 5 mm.

According to an example embodiment of the disclosure, the metal plate (e.g., the metal plate 5 in FIG. 5) may have a thickness in a range of 0.3 mm to about 1.5 mm.

According to an example embodiment of the disclosure, an electronic device (e.g., the electronic device 1 in FIG. 1) may include: a housing providing one surface (e.g., the second surface 102 in FIG. 2) of the device and having a thin plate form (e.g., the back cover 320 in FIG. 4). The housing may include: a metal plate (e.g., the metal plate 5 in FIG. 4) including at least one penetration hole (e.g., the plurality of penetration holes 54 and 55 in FIG. 5). The housing may include: a first nonmetallic part (e.g., the first nonmetallic part 41 in FIG. 4) combined with the metal plate. The housing may include: a second nonmetallic part (e.g., the second nonmetallic part 42 in FIG. 4) at least partially disposed in the at least one penetration hole. The one surface of the housing may include an area (e.g., the first front surface area FS1 in FIG. 4) defined by the first nonmetallic part, an area (e.g., the second front surface area FS2 in FIG. 4) defined by the second nonmetallic part, and an area (e.g., the third front surface area FS3 in FIG. 4) defined by the metal plate. The first nonmetallic part and the second nonmetallic part may be formed using a die (e.g., the die 8 in FIG. 8). The at least one penetration hole may be configured to guide a location where the metal plate is disposed within the die.

According to an example embodiment of the disclosure, a side surface of the metal plate may include an first area (e.g., the first area 531 in FIG. 17) and a second area (e.g., the second area 532 in FIG. 17). The first area may be closer to the one surface (e.g., the second surface 102 in FIG. 4) of the housing than the second area. A step (e.g., the stepped structure 1701 in FIG. 17) may be formed between the first area and the second area.

According to an example embodiment of the disclosure, the housing (e.g., the back cover 320 in FIG. 4) may include a plane part (e.g., the plane part P in FIG. 4) and a curved part (e.g., the first curved part C1, the second curved part C2, the third curved part C3, or the fourth curved part C4 in FIG. 4) surrounding at least a part of the plane part.

According to an example embodiment of the disclosure, the metal plate (e.g., the metal plate 5 in FIG. 4) may be disposed in the plane part (e.g., the plane part P in FIG. 4).

According to an example embodiment of the disclosure, the housing (e.g., the back cover 320 in FIG. 4) may have a thickness in a range of 1 mm to 5 mm.

According to an example embodiment of the disclosure, the housing (e.g., the back cover 320 in FIG. 4) may include a concave part (not illustrated). For example, the housing (e.g., the back cover 320 in FIG. 4) may include a plurality of concave parts (not illustrated) in which a plurality of rubber feet are disposed.

While the disclosure has been illustrated and described with reference to various example embodiments, it will be understood that the various example embodiments are intended to be illustrative, not limiting. Accordingly, one skilled in the art will understand that all changes or modified forms should be construed as being included in the scope of the disclosure in addition to the embodiments disclosed herein. It will also be understood that any of the embodiment(s) described herein may be used in conjunction with any other embodiment(s) described herein.

What is claimed is:

1. An electronic device comprising:
a housing defining at least one surface of the electronic device,
wherein the housing comprises:
a metal plate comprising at least one penetration hole;
a first nonmetallic part combined with the metal plate and surrounding at least a part of a side surface of the metal plate; and
a second nonmetallic part at least partially disposed in the at least one penetration hole and providing a part of the one surface,
wherein the first nonmetallic part and the second nonmetallic part comprise an identical nonmetallic material.

2. The electronic device of claim 1, wherein:
the first nonmetallic part and the second nonmetallic part are formed using a die, and
the at least one penetration hole is configured to guide a location where the metal plate is disposed within the die.

3. The electronic device of claim 2, wherein when viewed from a top of the one surface of the housing, the side surface comprises a concave-convex structure comprising a plurality of notches.

4. The electronic device of claim 2, wherein:
the side surface of the metal plate comprises a first area and a second area,
wherein the first area is closer to the one surface of the housing than the second area, and
a step is formed between the first area and the second area.

5. The electronic device of claim 2, wherein the one surface of the housing comprises an area defined by the first nonmetallic part, an area defined by the second nonmetallic part, and an area defined by the metal plate.

6. The electronic device of claim 5, wherein when viewed from a top of the one surface of the housing, the first nonmetallic part comprises a part overlapping the metal plate.

7. The electronic device of claim 2, wherein an edge of the housing is provided by the first nonmetallic part.

8. The electronic device of claim 2, wherein:
a part of the edge of the housing is provided by the first nonmetallic part, and
another part of the edge is provided by the metal plate.

9. The electronic device of claim 1, wherein the housing comprises a plane part and a curved part at least partially surrounding the plane part.

10. The electronic device of claim 9, wherein the metal plate is disposed in the plane part.

11. The electronic device of claim 9, wherein the metal plate extends from the plane part to the curved part.

12. The electronic device of claim 1, wherein the first nonmetallic part and the second nonmetallic part comprise different nonmetallic materials.

13. The electronic device of claim 1, wherein the housing comprises at least a part of a foldable housing.

14. The electronic device of claim 1, wherein the housing has a thickness in a range of 1 mm to 5 mm.

15. The electronic device of claim 1, wherein the first nonmetallic part entirely surrounds the side surface of the metal plate.

16. An electronic device comprising:
a housing defining at least one surface of the electronic device and having a thin plate form,
wherein the housing comprises:
a metal plate comprising at least one penetration hole;
a first nonmetallic part combined with the metal plate; and
a second nonmetallic part at least partially disposed in the at least one penetration hole,
wherein the one surface of the housing comprises an area defined by the first nonmetallic part, an area defined by the second nonmetallic part, and an area defined by the metal plate, and
the first nonmetallic part and the second nonmetallic part are formed using a die, and the at least one penetration hole is configured to guide a location where the metal plate is disposed within the die.

17. The electronic device of claim 16, wherein:
the side surface of the metal plate comprises a first area and a second area,
the first area is closer to the one surface of the housing than the second area, and
a step is formed between the first area and the second area.

18. The electronic device of claim 16, wherein the housing comprises a plane part and a curved part surrounding at least a part of the plane part.

19. The electronic device of claim 18, wherein the metal plate is disposed in the plane part.

20. The electronic device of claim 16, wherein the housing has a thickness in a range of 1 mm to 5 mm.

* * * * *